United States Patent
Kim et al.

(10) Patent No.: US 11,355,393 B2
(45) Date of Patent: Jun. 7, 2022

(54) ATOMIC PRECISION CONTROL OF WAFER-SCALE TWO-DIMENSIONAL MATERIALS

(71) Applicant: Massachusetts Institute of Technology, Cambridge, MA (US)

(72) Inventors: Jeehwan Kim, Cambridge, MA (US); Wei Kong, Cambridge, MA (US); Jaewoo Shim, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 17/270,246

(22) PCT Filed: Aug. 23, 2019

(86) PCT No.: PCT/US2019/047809
§ 371 (c)(1),
(2) Date: Feb. 22, 2021

(87) PCT Pub. No.: WO2020/041650
PCT Pub. Date: Feb. 27, 2020

(65) Prior Publication Data
US 2021/0327758 A1    Oct. 21, 2021

Related U.S. Application Data

(60) Provisional application No. 62/721,886, filed on Aug. 23, 2018.

(51) Int. Cl.
*H01L 21/78* (2006.01)
*H01L 21/02* (2006.01)
(Continued)

(52) U.S. Cl.
CPC ...... *H01L 21/7806* (2013.01); *H01L 21/0259* (2013.01); *H01L 21/02458* (2013.01);
(Continued)

(58) Field of Classification Search
None
See application file for complete search history.

(56) References Cited

U.S. PATENT DOCUMENTS

2015/0336800 A1   11/2015   Bedell et al.
2016/0137507 A1*   5/2016   You .................... H01L 21/0262
                                                          428/408
(Continued)

FOREIGN PATENT DOCUMENTS

WO    WO 2014/064057 A2    5/2014
WO    WO 2017/044577 A1    3/2017
(Continued)

OTHER PUBLICATIONS

International Search Report and Written Opinion for International Application No. PCT/US2019/047809, dated Nov. 5, 2019.
(Continued)

*Primary Examiner* — Alexander G Ghyka
(74) *Attorney, Agent, or Firm* — Wolf, Greenfield & Sacks, P.C.

(57) ABSTRACT

Embodiments of this disclosure include apparatus, systems, and methods for fabricating monolayers. In one example, a method includes forming a multilayer film having a plurality of monolayers of a two-dimensional (2D) material on a growth substrate. The multilayer film has a first side proximate the growth substrate and a second side opposite the first side.

12 Claims, 34 Drawing Sheets

(51) Int. Cl.
  *H01L 21/04*  (2006.01)
  *H01L 21/285*  (2006.01)
  *H01L 21/443*  (2006.01)
  *H01L 29/66*  (2006.01)

(52) U.S. Cl.
  CPC .. *H01L 21/02527* (2013.01); *H01L 21/02568* (2013.01); *H01L 21/043* (2013.01); *H01L 21/28575* (2013.01); *H01L 21/443* (2013.01); *H01L 29/66742* (2013.01); *H01L 29/66969* (2013.01)

(56) References Cited

U.S. PATENT DOCUMENTS

| | | | |
|---|---|---|---|
| 2017/0170260 A1* | 6/2017 | Dresselhaus | H01L 21/02422 |
| 2018/0158913 A1 | 6/2018 | Withers et al. | |
| 2019/0051553 A1* | 2/2019 | Kamin | H01L 21/6836 |

FOREIGN PATENT DOCUMENTS

| | | |
|---|---|---|
| WO | WO 2017/222592 A1 | 12/2017 |
| WO | WO 2017/222796 A2 | 12/2017 |
| WO | WO 2018/089444 A1 | 5/2018 |
| WO | WO 2018/089450 A1 | 5/2018 |
| WO | WO 2018/156876 A1 | 8/2018 |
| WO | WO 2018/156877 A1 | 8/2018 |
| WO | WO 2018/195152 A1 | 10/2018 |
| WO | WO 2018/195412 A1 | 10/2018 |
| WO | WO 2019/099461 A1 | 5/2019 |
| WO | WO 2019/246515 A1 | 12/2019 |

OTHER PUBLICATIONS

Shim, et al. "Controlled crack propagation for atomic precision handling of wafer-scale two-dimensional materials." Science, vol. 362, No. 6415, Nov. 9, 2018.
International Preliminary Report on Patentability for PCT/US2019/047809 dated Mar. 4, 2021.
Bae et al., Unveiling the carrier transport mechanism in epitaxial graphene for forming wafer-scale, single-domain graphene. Proc Natl Acad Sci. Apr. 18, 2017;114(16):4082-4086. doi: 10.1073/pnas.1620176114. Epub Apr. 3, 2017.
Bjorkman et al., van der Waals bonding in layered compounds from advanced density-functional first-principles calculations. Phys Rev Lett. Jun. 8, 2012;108(23):235502. doi: 10.1103/PhysRevLett.108.235502. Epub Jun. 7, 2012. 5 pages.
Britnell et al., Strong light-matter interactions in heterostructures of atomically thin films. Science. Jun. 14, 2013;340(6138):1311-4. doi: 10.1126/science.1235547. Epub May 2, 2013.
Chan et al., Suppression of thermally activated carrier transport in atomically thin MoS2 on crystalline hexagonal boron nitride substrates. Nanoscale. 2013;5:9572-6. Epub Aug. 8, 2013.
Choi et al., Flexible active-matrix organic light-emitting diode display enabled by MoS2 thin-film transistor. Science Advances. Apr. 2018;4:eaas8721. 7 pages.
Desai et al., Gold-Mediated Exfoliation of Ultralarge Optoelectronically-Perfect Monolayers. Adv Mater. Jun. 2016;28(21):4053-8. doi: 10.1002/adma.201506171. Epub Mar. 23, 2016.
Eichfeld et al., Highly scalable, atomically thin WSe2 grown via metal-organic chemical vapor deposition. ACS Nano. Feb. 24, 2015;9(2):2080-7. doi: 10.1021/nn5073286. Epub Feb. 2, 2015.
Elias et al., Controlled synthesis and transfer of large-area WS2 sheets: from single layer to few layers. ACS Nano. Jun. 25, 2013;7(6):5235-42. doi: 10.1021/nn400971k. Epub May 15, 2013.
Geim et al., Van der Waals heterostructures. Nature. Jul. 25, 2013;499(7459):419-25. doi: 10.1038/nature12385.
Georgiou et al., Vertical field-effect transistor based on graphene-WS2 heterostructures for flexible and transparent electronics. Nat Nanotechnol. Feb. 2013;8(2):100-3. doi: 10.1038/nnano.2012.224. Epub Dec. 23, 2012.

Gong et al., Vertical and in-plane heterostructures from WS2/MoS2 monolayers. Nat Mater. Dec. 2014;13(12):1135-42. doi: 10.1038/nmat4091. Epub Sep. 28, 2014.
Gutierrez et al., Extraordinary room-temperature photoluminescence in triangular WS2 monolayers. Nano Lett. Aug. 14, 2013;13(8):3447-54. doi: 10.1021/nl3026357. Epub Dec. 14, 2012.
He et al., Revealing Defect-State Photoluminescence in Monolayer WS2 by Cryogenic Laser Processing. ACS Nano. 2016;10(6):5847-55. Epub Jun. 13, 2016.
Huo et al., Optoelectronics based on 2D TMDs and heterostructures. Journal of Semiconductors. 2017;38:031002. 9 pages.
Kang et al., High-mobility three-atom-thick semiconducting films with wafer-scale homogeneity. Nature. Apr. 30, 2015;520(7549):656-60. doi: 10.1038/nature14417.
Kang et al., Layer-by-layer assembly of two-dimensional materials into wafer-scale heterostructures. Nature. Oct. 12, 2017;550(7675):229-233. doi: 10.1038/nature23905. Epub Sep. 20, 2017.
Kim et al., 10.5% efficient polymer and amorphous silicon hybrid tandem photovoltaic cell. Nat Commun. 2015;6:6391(1-6). doi: 10.1038/ncomms7391. 6 pages. Epub Mar. 4, 2015.
Kim et al., 9.4% efficient amorphous silicon solar cell on high aspect-ratio glass microcones. Adv Mater. Jun. 2014;26(24):4082-6. Epub Mar. 20, 2014.
Kim et al., A method for fabricating dislocation-free tensile-strained SiGe films via the oxidation of porous Si substrates. Appl Phys Lett. 2007;91(25):252108(1-3). Epub Dec. 19, 2007.
Kim et al., Engineering of contact resistance between transparent single-walled carbon nanotube films and a-Si:H single junction solar cells by gold nanodots. Adv Mater. Apr. 10, 2012;24(14):1899-902. doi: 10.1002/adma.201104677. Epub Mar. 5, 2012.
Kim et al., Fabrication of dislocation-free tensile strained Si thin films using controllably oxidized porous Si substrates. Appl. Phys. Lett. 2006;89:152117. Epub Oct. 12, 2006. 3 pages.
Kim et al., High efficiency Cu2ZnSn(S,Se)4 solar cells by applying a double In2S3/CdS emitter. Adv Mater. Nov. 2014;26(44):7427-31. Epub Aug. 25, 2014.
Kim et al., Layer-resolved graphene transfer via engineered strain layers. Science. Nov. 15, 2013;342(6160):833-6.
Kim et al., Principle of direct van der Waals epitaxy of single-crystalline films on epitaxial graphene. Nat Commun. Sep. 2014;5:4836. doi:10.1038/ncomms5836. 7 pages.
Kim et al., Remote epitaxy through graphene enables two-dimensional material-based layer transfer. Nature 2017;544:340-3. Epub Apr. 20, 2017. Methods included. 12 pages total.
Kim et al., Synthesis of large-area multilayer hexagonal boron nitride for high material performance. Nature Communications. 2015;6. Epub Oct. 28, 2015. 11 pages.
Kong et al., Polarity governs atomic interaction through two-dimensional materials. Nat Materials. Nov. 2018;17:999-1004.
Lan et al., Synthesis of Large-Scale Single-Crystalline Monolayer WS2 Using a Semi-Sealed Method. Nanomaterials. 2018;8:100. Epub Feb. 11, 2018. 7 pages.
Lee et al., Atomically thin p-n junctions with van der Waals heterointerfaces. Nat Nanotechnol. Sep. 2014;9(9):676-81. doi: 10.1038/nnano.2014.150. Epub Aug. 10, 2014.
Lee et al., Highly Stable, Dual-Gated MoS2 Transistors Encapsulated by Hexagonal Boron Nitride with Gate-Controllable Contact, Resistance, and Threshold Voltage. ACS Nano. Jul. 28, 2015;9(7):7019-26. doi: 10.1021/acsnano.5b01341. Epub Jun. 22, 2015.
Lin et al., Atomically thin resonant tunnel diodes built from synthetic van der Waals heterostructures. Nature Communications. 2015;6:7311. Epub Jun. 19, 2015. 6 pages.
Molina-Sanchez et al., Phonons in single-layer and few-layer MoS2 and WS2. Phys. Rev. B. Oct. 11, 2011;84:155413. 8 pages.
Novoselov et al., Electric field effect in atomically thin carbon films. Science. Oct. 22, 2004;306(5696):666-9. doi: 10.1126/science.1102896.
Park et al., Layer-modulated synthesis of uniform tungsten disulfide nanosheet using gas-phase precursors. Nanoscale. Jan. 28, 2015;7(4):1308-13. doi: 10.1039/c4nr04292a. Accepted manuscript provided. 6 pages.

(56) References Cited

OTHER PUBLICATIONS

Rydberg et al., Van der Waals density functional for layered structures. Phys Rev Lett. Sep. 19, 2003;91(12):126402. doi: 10.1103/PhysRevLett.91.126402. Epub Sep. 18, 2003. 4 pages.
Sasaki et al., Growth and optical properties of Nb-doped WS2 monolayers. Applied Physics Express. 2016;9:071201. Epub Jun. 2, 2016. 4 pages.
Schmidt et al., Electronic transport properties of transition metal dichalcogenide field-effect devices: surface and interface effects. Chem Soc Rev. Nov. 7, 2015;44(21):7715-36. doi: 10.1039/c5cs00275c.
Shim et al., Controlled crack propagation for atomic precision handling of wafer-scale two-dimensional materials. Nanomaterials. Nov. 9, 2018;362:665-70.
Shim et al., Phosphorene/rhenium disulfide heterojunction-based negative differential resistance device for multi-valued logic. Nature Communications. 2016;7:13413. Epub Nov. 7, 2016. 8 pages.
Suo et al., Steady-state cracking in brittle substrates beneath adherent films. International Journal of Solids and Structures. 1989;25(11):1337-53.
Xu et al., Interface structure and mechanics between graphene and metal substrates: a first-principles study. J Phys Condens Matter. Dec. 8, 2010;22(48):485301. doi: 10.1088/0953-8984/22/48/485301. Epub Nov. 12, 2010. 5 pages.

\* cited by examiner

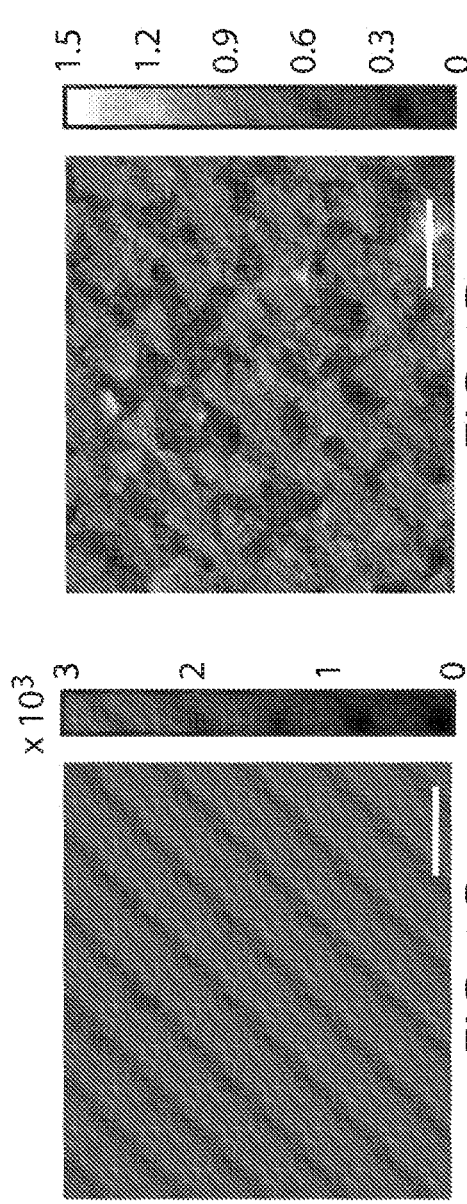
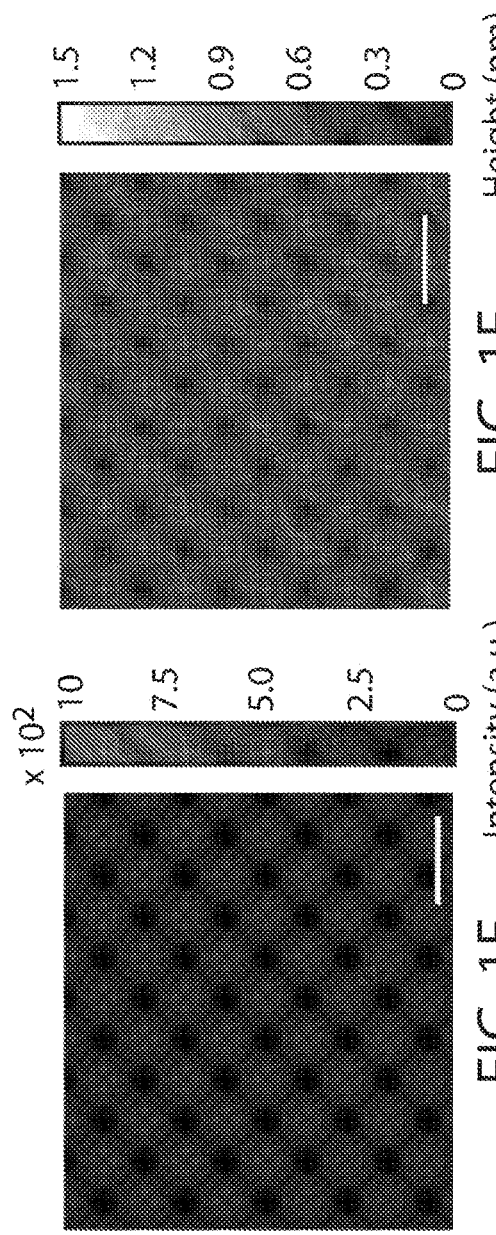
FIG. 1C  FIG. 1D
FIG. 1E  FIG. 1F

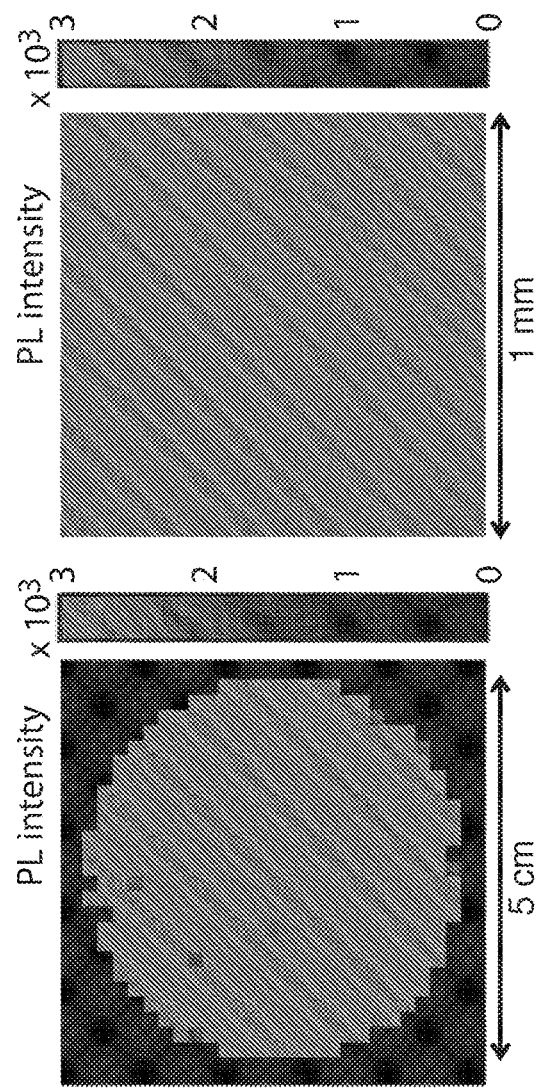
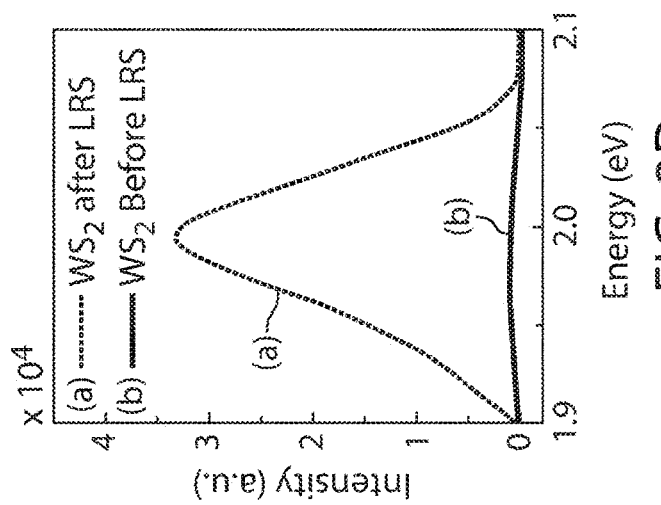
FIG. 2D
FIG. 2E
FIG. 2F

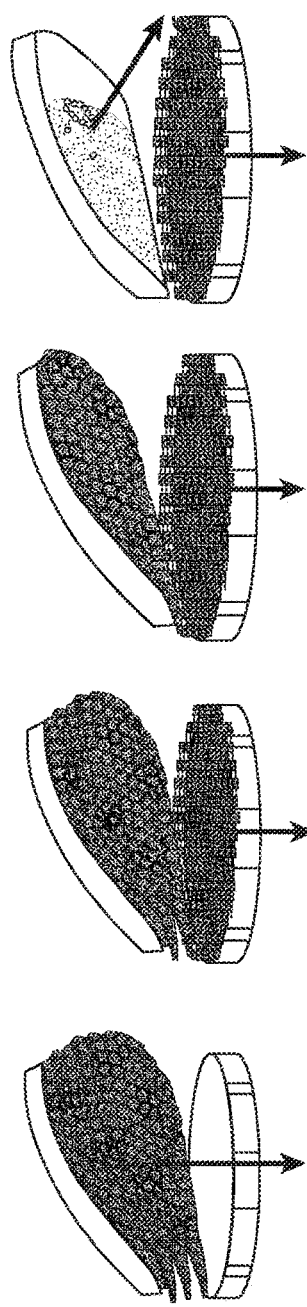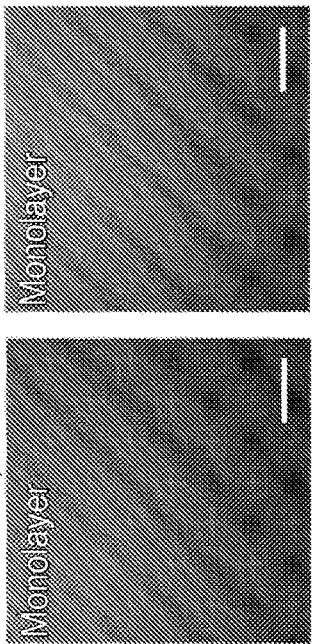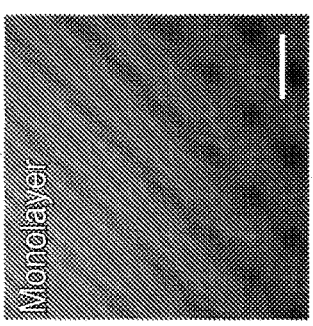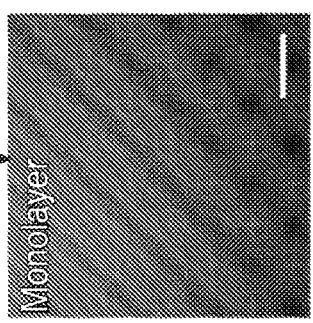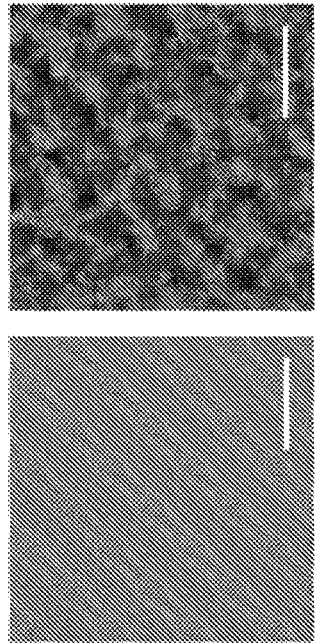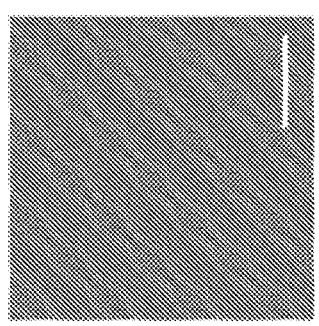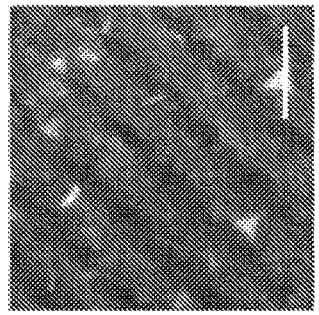

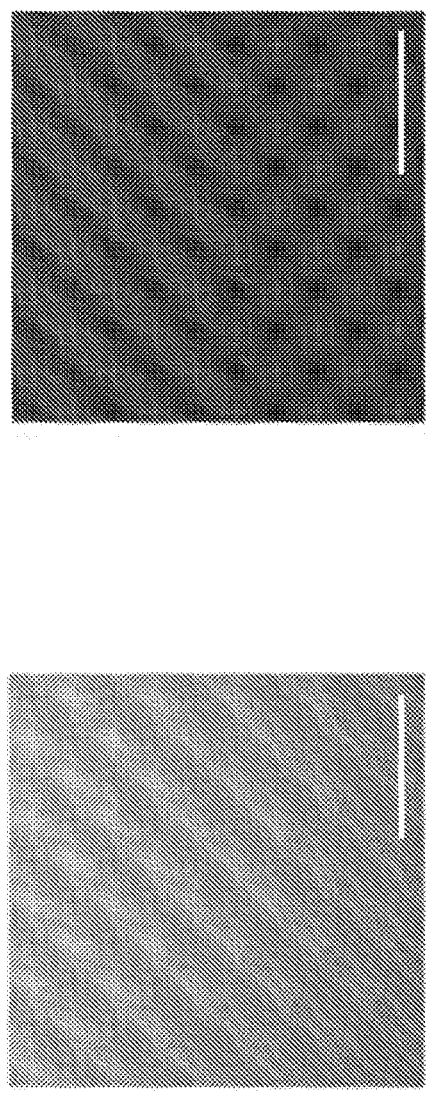
FIG. 13A
FIG. 13B
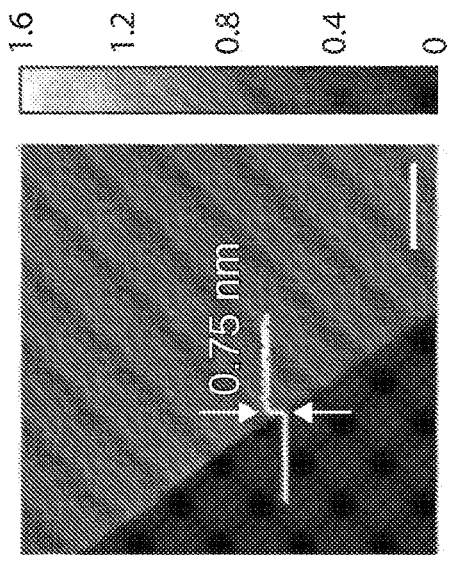
FIG. 13D
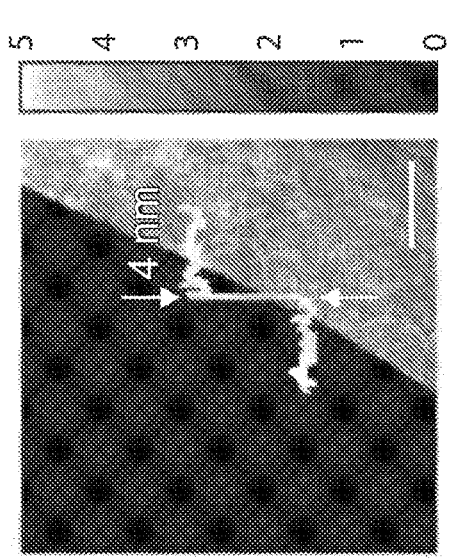
FIG. 13C

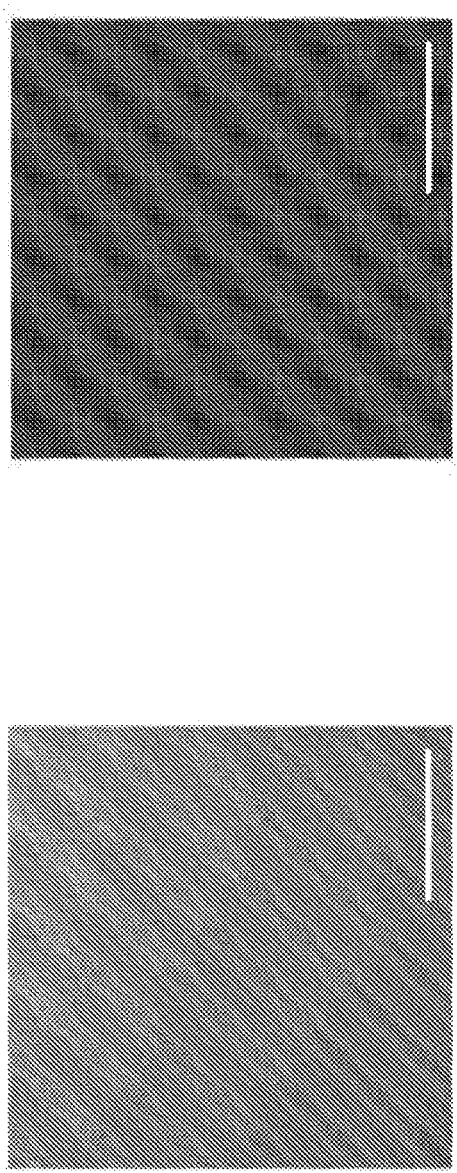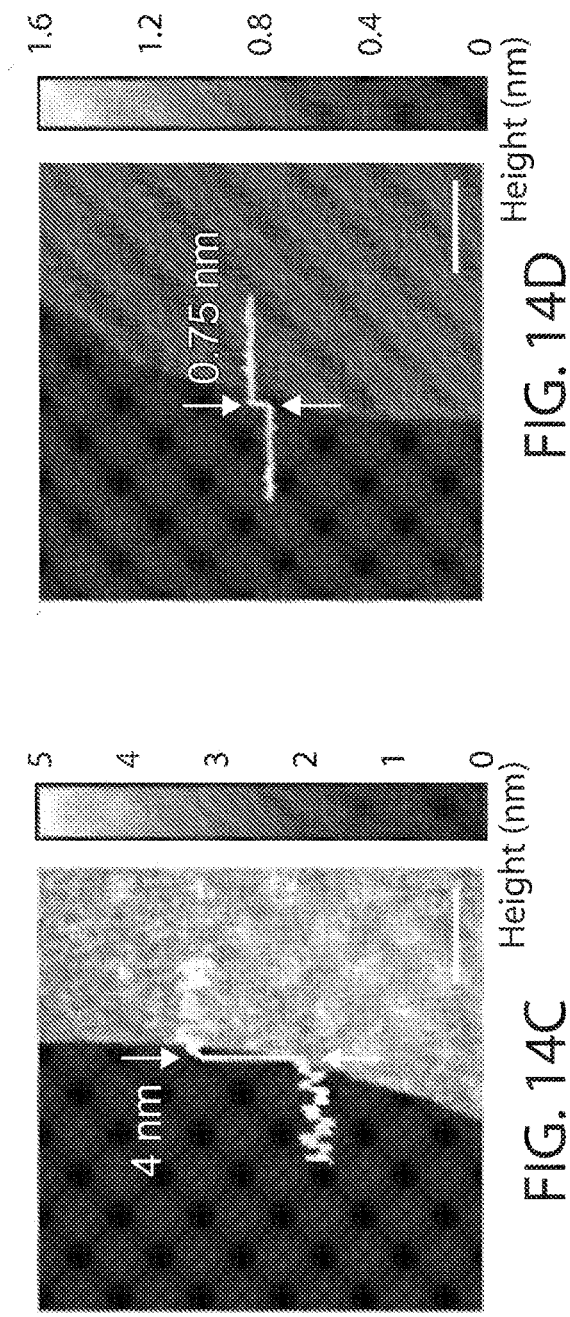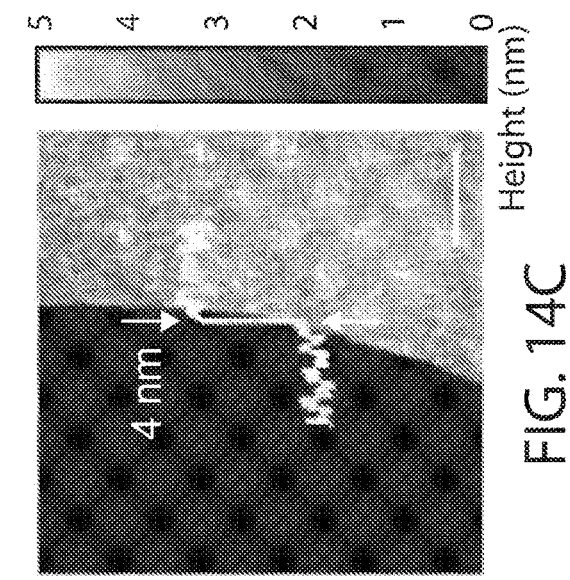
FIG. 14A  FIG. 14B  FIG. 14C  FIG. 14D

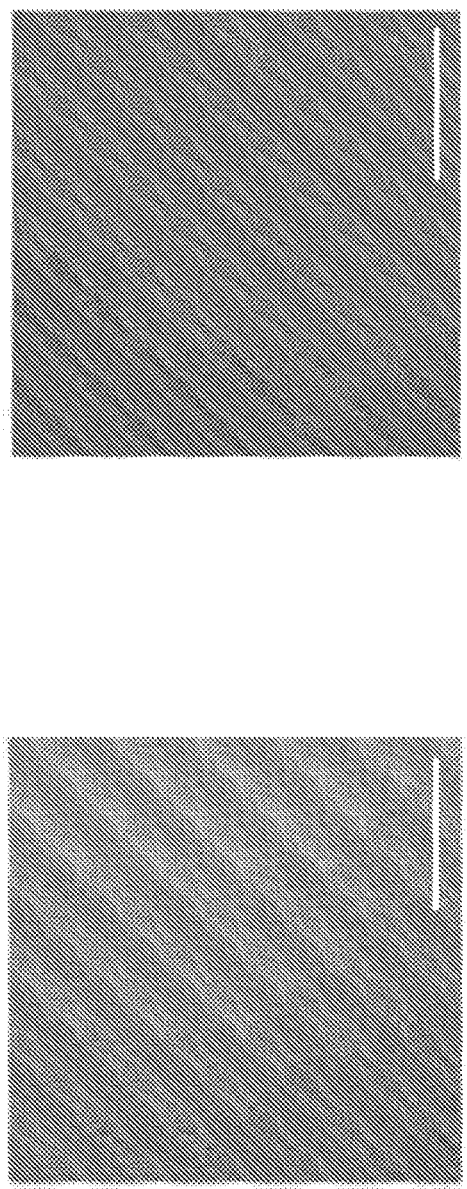
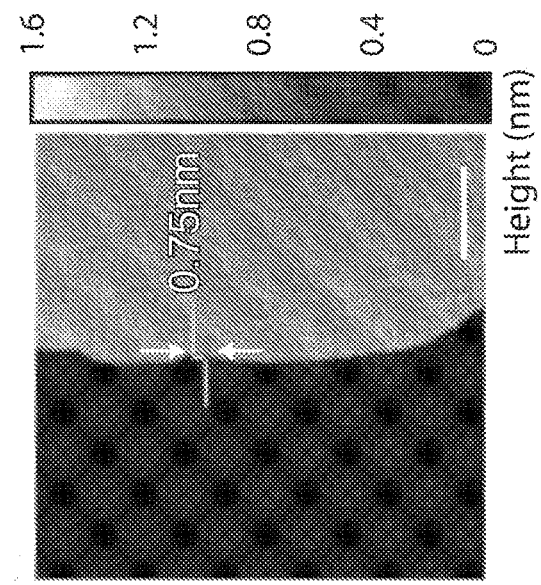
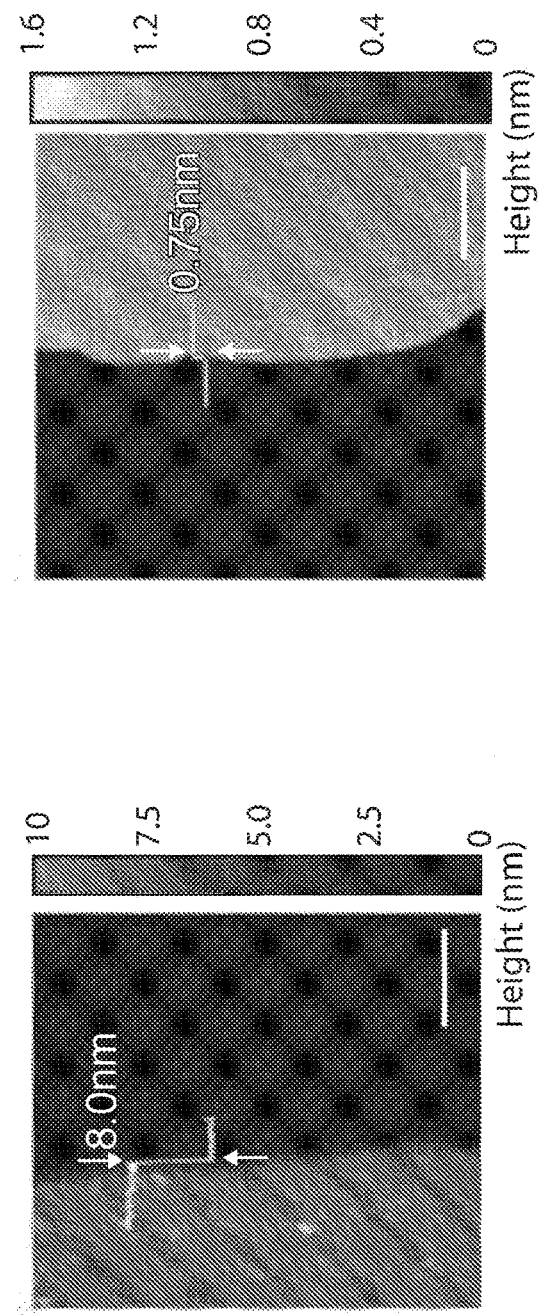
FIG. 15A
FIG. 15B
FIG. 15C
FIG. 15D

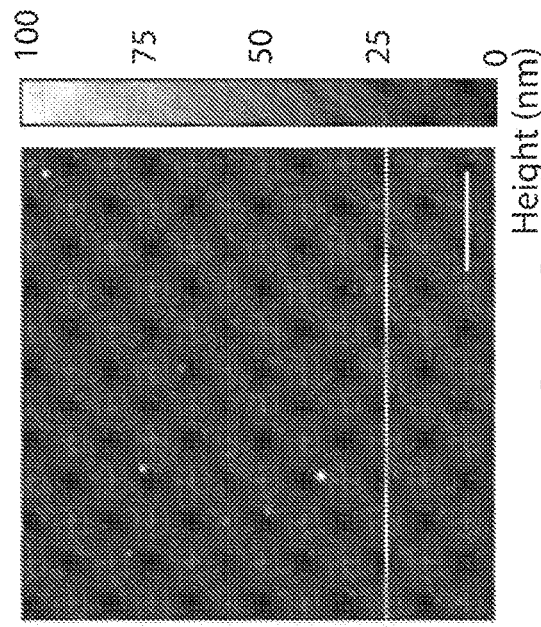
FIG. 17B
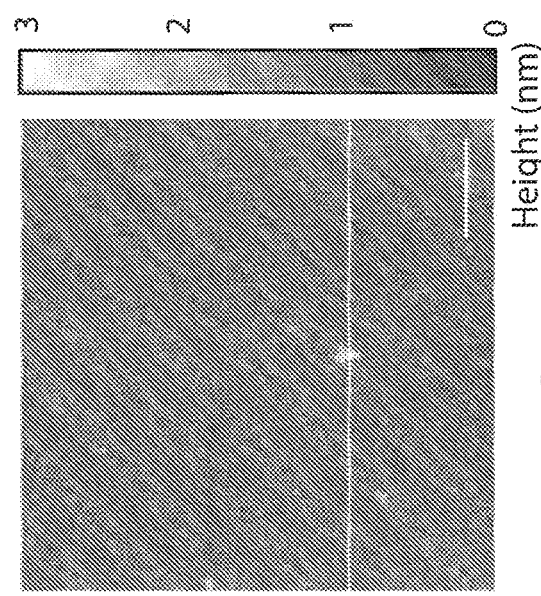
FIG. 17A
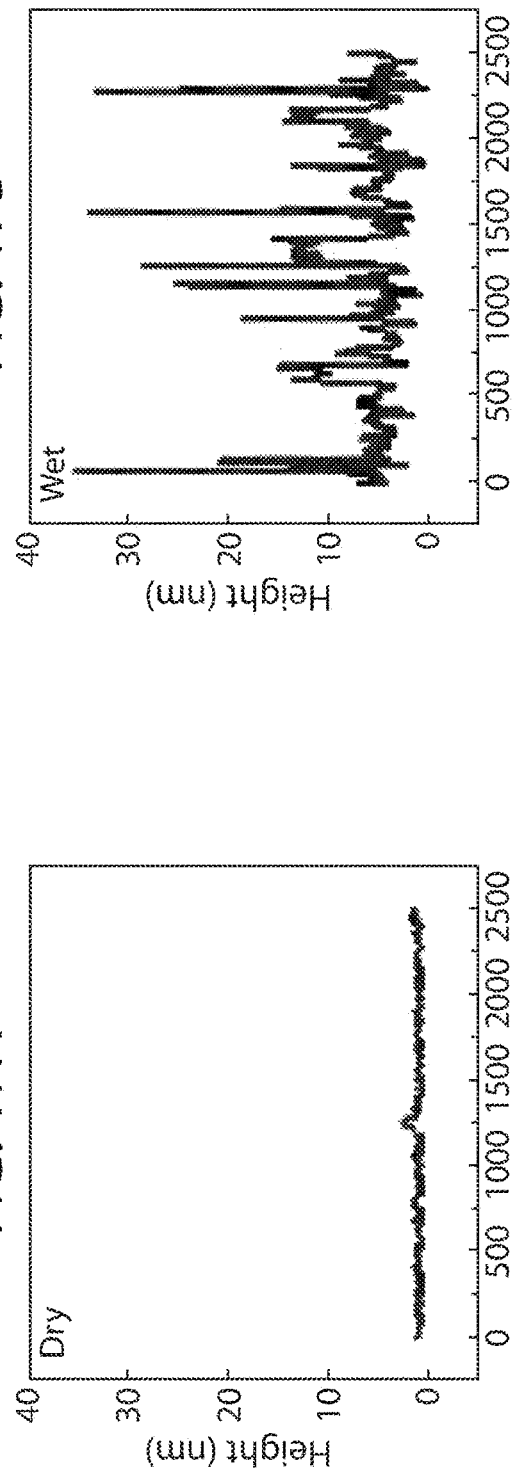
FIG. 17D
FIG. 17C

ATOMIC PRECISION CONTROL OF WAFER-SCALE TWO-DIMENSIONAL MATERIALS

RELATED APPLICATIONS

This application is a U.S. national stage application of International Patent Application No. PCT/US2019/047809, filed Aug. 23, 2019, and entitled "ATOMIC PRECISION CONTROL OF WAFER-SCALE TWO-DIMENSIONAL MATERIALS," which claims the benefit under 35 U.S.C. § 119(e) of U.S. Provisional Application No. 62/721,886, filed on Aug. 23, 2018, and entitled "ATOMIC PRECISION CONTROL OF WAFER-SCALE TWO-DIMENSIONAL MATERIALS," each of which is incorporated herein by reference in its entirety for all purposes.

TECHNICAL FIELD

Embodiments including apparatus, systems, and methods for fabricating monolayers are disclosed.

BACKGROUND

Two-dimensional (2D) materials have superior in-plane stability and weak out-of-plane interactions and therefore can be stacked together to form a multitude of devices with a broad spectrum of functionalities. In order to tailor the 2D heterostructure characteristics for specific functionalities, it can be helpful to isolate 2D materials into monolayer films and stack them with monolayer precision. Currently, the most common approach to assemble these 2D layers is using the scotch-tape method, which has been used to stack micron-scale flakes of 2D material. However, the scotch-tape method suffers from low reliability when producing monolayer 2D crystals from bulk materials. In addition, the process can become very complicated if the heterostructure design involves several different types of 2D material monolayers. In this case, multiple monolayer flakes are initially secured for each 2D material, which is usually time consuming. Furthermore, while the isolation of flakes into nominal monolayers has been demonstrated, the lateral dimensions (e.g., hundreds of microns) are usually not sufficient to fabricate large-scale 2D heterostructure.

Another approach to fabricate 2D heterostructure is direct growth. However, monolayer-by-monolayer growth of 2D material is usually challenging due to the formation of additional nuclei on top of the initial nucleating layer during growth. For example, direct growth can be used for wafer-scale monolayer growth of transition metal dichalcogenides (TMDCs), but the growth can take about 26 hours for a single monolayer to suppress the formation of additional nuclei. The time can be even longer when the 2D heterostructures include multiple monolayers of 2D materials.

SUMMARY

Embodiments of the present invention include apparatus, systems, and methods for fabricating monolayers. In one example, a method includes forming a multilayer film having a plurality of monolayers of a two-dimensional (2D) material on a growth substrate. The multilayer film has a first side proximate the growth substrate and a second side opposite the first side. The method also includes forming a first metal layer on the second side of the multilayer film and removing the multilayer film from the growth substrate using the metal layer. The method also includes forming a second metal layer on the first side of the multilayer film and removing a first monolayer from the plurality of monolayers in the multilayer film.

In another example, a method of fabricating a heterostructure includes forming a first multilayer film having a first plurality of monolayers of a first two-dimensional (2D) material on a first growth substrate and removing the first multilayer film from the first growth substrate to expose a first bottom surface of the first multilayer film. The method also includes peeling a first monolayer in the first plurality of monolayers from the first bottom surface of the first multilayer film and disposing the first monolayer on a host substrate. The method also includes forming a second multilayer film having a second plurality of monolayers of a second 2D material on a second growth substrate and removing the second multilayer film from the second growth substrate to expose a second bottom surface of the second multilayer film. The method also includes peeling a second monolayer in the second plurality of monolayers from the second bottom surface of the second multilayer film and disposing the second monolayer on the first monolayer to form the heterostructure.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1C shows a Raman intensity mapping at $E^1_{2g}$ peak (353 cm$^{-1}$) of tungsten disulfide (WS$_2$) grown on a sapphire substrate with a continuous wave laser at a wavelength and power of 532 nm and 2 mW, respectively. The scale bars for the Raman mapping images are 100 µm.

FIG. 1D shows an atomic force microscope (AFM) topology taken from the top of as-grown 4-nm-thick WS$_2$ on the sapphire wafer. The scale bars for the AFM topology images are 50 nm.

FIG. 1E shows a Raman intensity mapping at $E^1_{2g}$ peak (353 cm$^{-1}$) on sapphire substrate after exfoliation of WS$_2$ layer with a laser wavelength and power of 532 nm and 2 mW, respectively.

FIG. 1F shows an AFM topology taken from the bottom of a WS$_2$ layer after exfoliation.

FIG. 2D shows representative photoluminescence (PL) spectra of as-exfoliated 4-nm-thick $WS_2$ and monolayer $WS_2$ obtained by LRS process.

FIG. 2E shows a wafer-scale PL mapping image at 1.98 eV of $WS_2$ on a $SiO_2$/Si wafer, where the spatial resolution is 2 mm.

FIG. 2F shows a large-scale (1 mm×1 mm) PL mapping image at 1.98 eV of $WS_2$ on SiO2, where the spatial resolution is 50 μm (see FIG. 8 for 1 μm resolution map).

FIG. 3A-FIG. 3J illustrate splitting of a thick 2D material layer into multiple monolayers via LRS.

FIG. 13A-FIG. 13E illustrate splitting of $MoSe_2$ into monolayers using LRS.

FIG. 14A-FIG. 14E illustrate splitting of $WSe_2$ into monolayers using LRS technique.

FIG. 15A-FIG. 15E show data for the split of $MoS_2$ into monolayer using LRS technique.

FIG. 15A-FIG. 15B show optical microscopy images and FIG. 15C-FIG. 15D show AFM images with height profiles, for as-exfoliated thick $MoS_2$ (FIG. 15A) and (FIG. 15C), and monolayer $MoS_2$ obtained by LRS process (FIG. 15B) and (FIG. 15D). Scale bars for optical microscopy images and AFM images are 50 μm and 1 μm, respectively. FIG. 15E shows representative Raman spectra for as-exfoliated thick $MoS_2$ and monolayer $MoS_2$ obtained by LRS process.

FIG. 17A-FIG. 17D show a comparison of a dry LRS process with a wet transfer process.

DETAILED DESCRIPTION

Figure 1A:
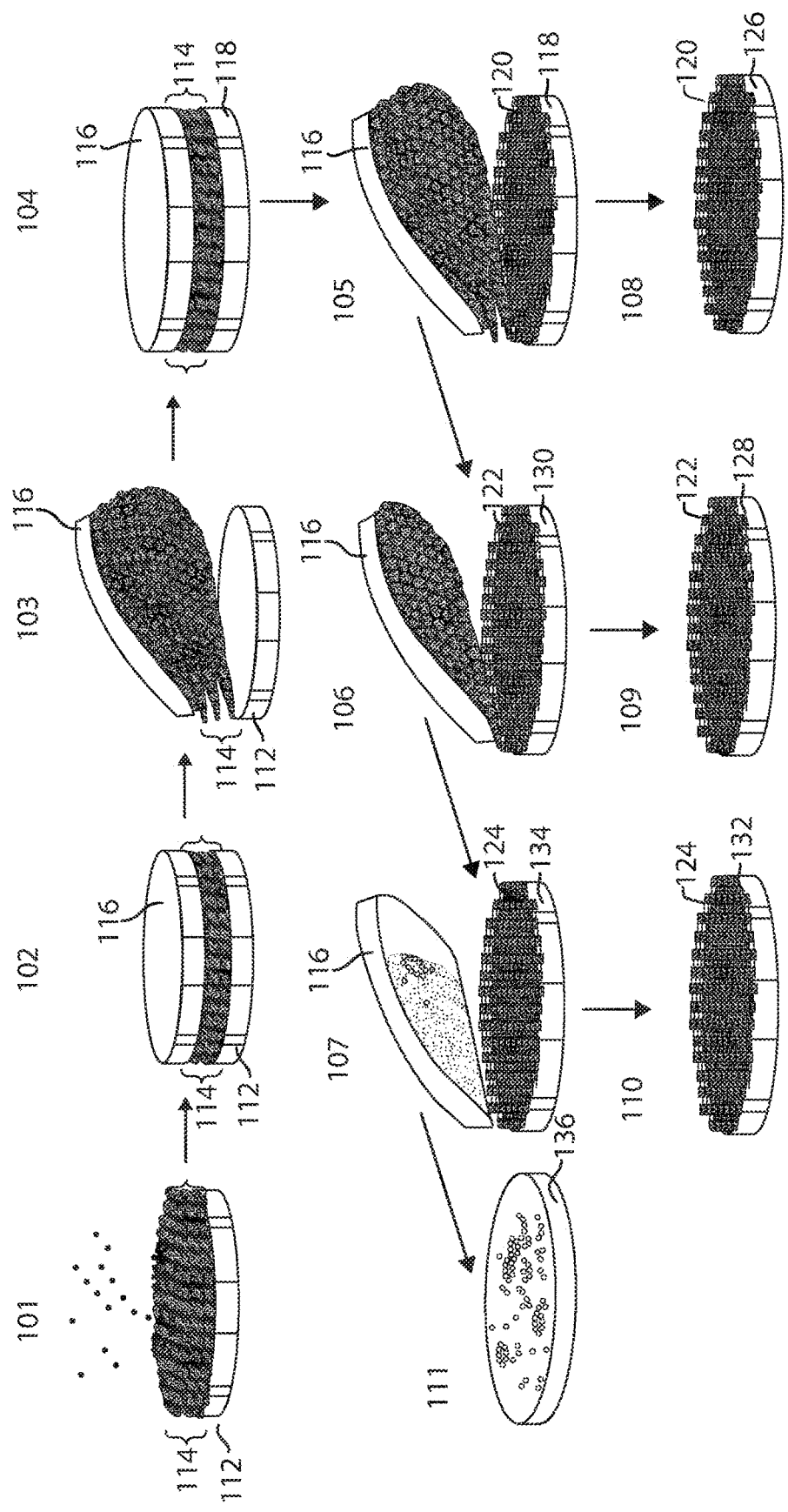
FIG. 1A illustrates a method of producing monolayers via a layer resolved splitting (LRS) technique.

To address the drawbacks in conventional approaches to fabricate two-dimensional (2D) heterostructures, methods and systems described herein employ a layer-resolved splitting (LRS) technique that enables high throughput production of multiple monolayers of "wafer-scale" 2D material from a single stack of thick 2D material grown on a wafer. In this technique, a thick layer of 2D materials (i.e. greater than one atomic layer) is grown on a substrate (e.g., via "one short growth" without suppressing the additional nuclei on the top surface), followed by a wafer-scale splitting process to split the multilayers into individual monolayers. This LRS technique allows high throughput production of monolayer 2D materials with single-atom thickness precision for the fabrication of wafer-scale van der Waals heterostructures.

In a typical scotch tape method, the 2D material is first peeled off from its bulk crystals by using a scotch tape. The cleaved thin crystals on the scotch tape are then brought into contact with a target substrate and rubbed to further cleave them. After the scotch tape is removed, layers of the 2D materials are left on the substrate. However, this scotch tape method produces 2D materials having different sizes and thicknesses that are randomly distributed over the substrate, and only a small fraction of these 2D materials are atomically thin. In other words, it is challenging to precisely control the size and thickness of the produced 2D material.

In contrast, the LRS technique described herein harvests the multilayers into individual monolayers through a wafer-scale splitting process. In addition, this allows high throughput production of monolayer 2D materials with single-atom thickness precision for the fabrication of wafer-scale 2D heterostructures.

The wafer-scale LRS technique described herein can be used to produce monolayers of various types of 2D materials, including tungsten disulfide ($WS_2$), molybdenum diselenide ($MoSe_2$), tungsten diselenide ($WSe_2$), and hexagonal boron nitride (h-BN). The monolayers can be readily stacked for constructing wafer-scale 2D heterostructures. The underlying mechanics for precise control of crack propagation are used to split 2D material multilayers into multiple individual monolayers. Experimental characterizations of the LRS technique show that the wafer-scale monolayer of transition metal dichalcogenides exhibits indirect-to-direct band gap transition uniformly across a 2-inch wafer. This digital control of monolayer 2D materials allows the construction of wafer-scale van der Waals heterostructures with single-atom thickness resolution. In addition, dry-stacking the monolayers to form a wafer-scale heterostructure substantially improves uniformity in terms of electrical characteristics and enhances performance in terms of optical characteristics of the heterostructure compared to preparing the heterostructure by wet-stacking.

In one aspect, methods are provided. In some embodiments, the method comprises forming a multilayer film comprising a plurality of monolayers of a two-dimensional (2D) material on a growth substrate, the multilayer film having a first side proximate to the growth substrate and a second side opposite the first side. In some embodiments, forming the multilayer film comprises epitaxially growing the multilayer film on the growth substrate. In some embodiments, the 2D material comprises at least one of graphene, tungsten disulfide ($WS_2$), molybdenum diselenide ($MoSe_2$), tungsten diselenide ($WSe_2$), or hexagonal boron nitride (h-BN).

In some embodiments, the method comprises (e.g., further comprises) forming a first metal layer on the second side of the multilayer film. In some embodiments, the first metal layer comprises nickel. In some embodiments, forming the first metal layer comprises sputtering metal on the second side of the multilayer film.

In some embodiments, the method comprises (e.g., further comprises) removing the multilayer film from the growth substrate using the metal layer. In some embodiments, removing the multilayer film from the growth substrate comprises applying a bending moment to the metal layer so as to generate and propagate a crack along an interface between the multilayer film and the growth substrate.

In some embodiments, the method comprises (e.g., further comprises) forming a second metal layer on the first side of the multilayer film.

In some embodiments, the method comprises (e.g., further comprises) removing a first monolayer from the plurality of monolayers in the multilayer film. In some embodiments, the method further comprises forming a third metal layer on a new first side of a multilayer film that results from removing the first monolayer from the plurality of monolayers. In some embodiments, the method further comprises removing a second monolayer from the plurality of monolayers in the multilayer film. In some embodiments, the method further comprises disposing the first monolayer over a second monolayer to form a heterostructure. In some embodiments, the first monolayer has a lateral dimension substantially equal to or greater than 1 inch. In some embodiments, the first monolayer comprises $WSe_2$, the second monolayer comprises graphene, and the heterostructure comprises a transistor.

In another aspect, methods of fabricating a heterostructure are provided. In some embodiments, the method comprises forming a first plurality of monolayers of a first two-dimensional (2D) material on a first growth substrate. In some embodiments, the method comprises (e.g., further comprises) removing the first plurality of monolayers from the first growth substrate.

In some embodiments, the method comprises (e.g., further comprises) peeling a first monolayer in the first plurality of monolayers from a bottom surface of the first plurality of monolayers. In some embodiments, the method comprises (e.g., further comprises) disposing the first monolayer on a host substrate.

In some embodiments, the method comprises (e.g., further comprises) forming a second plurality of monolayers of a second 2D material on a second growth substrate. In some embodiments, the method comprises (e.g., further comprises) removing the second plurality of monolayers from the second growth substrate. In some embodiments, the method comprises (e.g., further comprises) peeling a second monolayer in the second plurality of monolayers from a bottom surface of the second plurality of monolayers. In some embodiments, the method comprises (e.g., further comprises) disposing the second monolayer on the first monolayer to form the heterostructure. In some embodiments, the first monolayer comprises $WSe_2$, the second monolayer comprises graphene, and/or the heterostructure comprises a transistor.

FIG. 1A illustrates a method of producing monolayers via the LRS technique. First, a thick layer of 2D material (including more than one monolayer, also referred to as a multilayer film) is grown on a substrate (e.g., sapphire). For example, step 101 of FIG. 1A shows the growth of a thick 2D material 114 on a sapphire wafer 112. Due to the difficulty in controlling the nucleation of the 2D material, new nucleation sites tend to appear on the top surface of the initial nucleation layer on the wafer before full substrate coverage. Therefore, this direct growth of multilayer 2D materials usually results in irregular, discontinuous films at the top, while leaving uniform continuous films underneath. Once the entire multilayer film is removed from the wafer, the pristine continuous films can be accessed from the bottom of the stack.

The continuous 2D material films on the bottom of the multilayer film can be split into multiple monolayers via the LRS process, which is based on contrast in interfacial toughness ($\Gamma$) among the involved materials. As shown in FIG. 1A, a metal layer (e.g., 600-nm-thick nickel (Ni) film) can be formed on the multilayer film as an atomic scale glue to adhere to the 2D materials. For example, step 102 of FIG. 1A shows the deposition of a top Ni sticker 116 onto the thick 2D material 114. The interfacial toughness $\Gamma$ between the 2D material and Ni ($\Gamma_{2D-Ni}$~1.4 $J \cdot m^{-2}$) is about three times higher than that of the van der Waals interface between the layers in the 2D material stack ($\Gamma_{2D-2D}$=0.45 $J \cdot m^{-2}$). The interfacial toughness $\Gamma$ between 2D materials and sapphire ($\Gamma_{2D-Shappire}$) can be empirically deduced; its average value ($\Gamma_{2D-Shappire}$=0.26 $J \cdot m-2$) is smaller than $\Gamma_{2D-2D}$.

The thickness of the multilayer can be, for example, about 1 nm to about 50 nm (e.g., about 1 nm, about 2 nm, about 3 nm, about 5 nm, about 10 nm, about 20 nm, about 30 nm, or about 50 nm, including any values and sub ranges in between). The lateral size of the multilayer (and accordingly the lateral size of the monolayers produced from this multilayer film) can be about 0.1 inch to about 10 inches (e.g., about 0.1 inch, about 0.2 inch, about 0.5 inch, about 1 inch, about 2 inches, about 3 inches, about 5 inches, or about 10 inches, including any values and sub ranges in between). In one example, the method illustrated in FIG. 1A can be performed manually. In another example, a machine can be used to perform the method illustrated in FIG. 1A with a uniform force applied across the multilayer film.

The metal layer can include various types of materials, such as Ni, Ti, Cu, Ag, and Au. The thickness of the metal layer can be, for example, about 400 nm to about 10 μm (e.g., about 400 nm, about 1 μm, about 2 μm, about 3 μm, about 5 μm, or about 10 μm, including any values and sub ranges in between). In addition, non-metal materials, such as $Si_3N_4$, may also be employed to apply tensile stress to the multilayer film and produce the monolayers. In one example, the metal layer can be formed via a thermal evaporation method. In another example, the metal layer can be formed via an e-beam evaporation method. In yet another example, the metal layer can be formed using an atomic layer deposition method.

In an example, step 103 of FIG. 1A shows the exfoliation of the entire thick 2D material 114 with Ni sticker 116. Step 104 of FIG. 1A shows the deposition of a second Ni layer 118 on the bottom of thick 2D material 114. Step 105 of FIG. 1A shows a first split of a first monolayer 120 from the thick 2D material using second Ni layer 118. Step 106 of FIG. 1A shows a repeated split of a second monolayer 122 from the remaining 2D material using a third Ni layer 130. Step 107 of FIG. 1A shows a last split of a third monolayer 124 from the remaining 2D material using a fourth Ni layer 134. Step 108 of FIG. 1A shows a transfer to a host wafer 126 of first monolayer 120 from the second Ni layer 118. Step 109 of FIG. 1A shows a transfer to a host wafer 128 of second monolayer 122 from third Ni layer 130. Step 110 of FIG. 1A shows a transfer to a host wafer 132 of third monolayer 124 from fourth Ni layer 134. Step 111 of FIG. 1A shows a transfer to a host wafer 136 of the remains of the 2D material from Ni sticker 116.

Figure 1B:
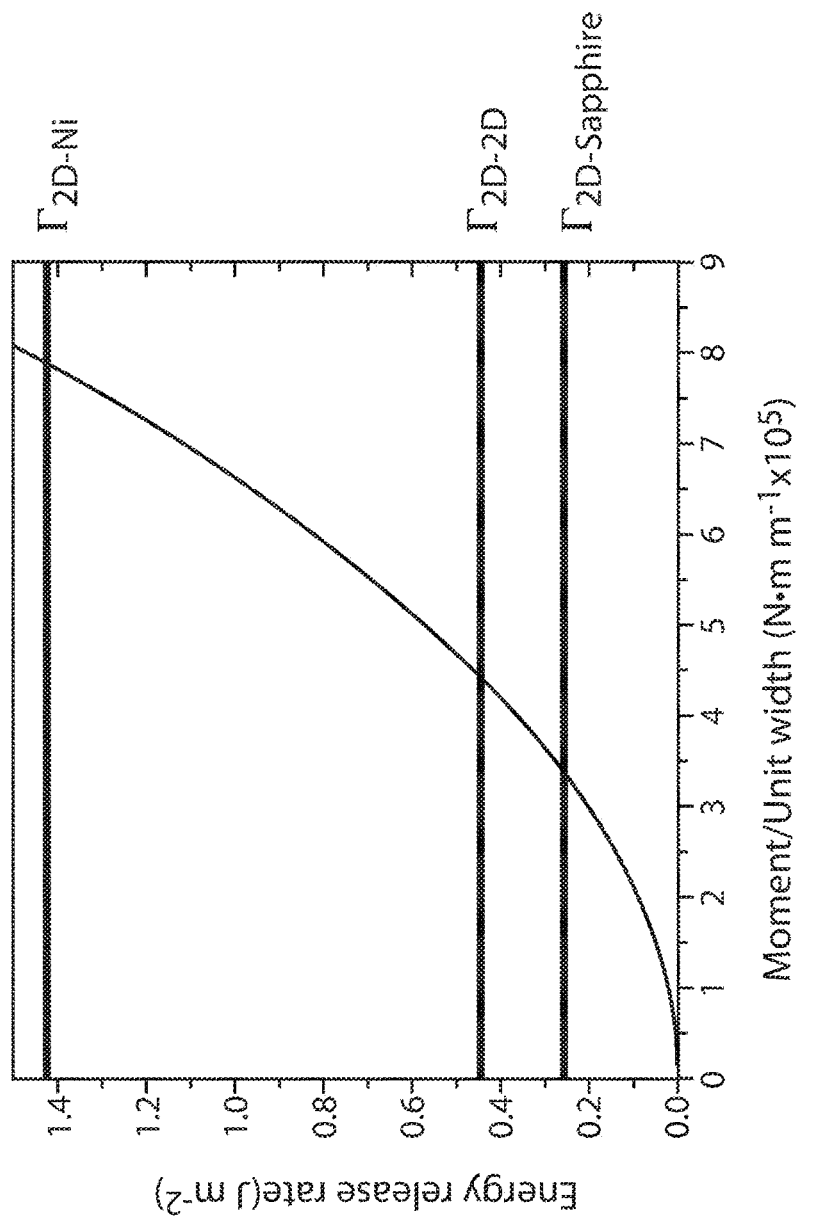
FIG. 1B shows calculated energy release rate versus the moment applied to the metal layer in the LRS method illustrated in FIG. 1A.

FIG. 1B shows calculated energy release rate versus the applied moment on the metal layer. The metal layer used in the calculation includes a Ni film that is about 600 nm thick. As shown in FIG. 1B, application of a bending moment during the lift-off of a Ni/2D material stack on sapphire supplies elastic strain energy to the bottom interfaces. This bending can be applied by bending the tape/metal/2D material stack at the edge after the 2D material is peeled off from the substrate. For 2-inch 2D materials, the thick layer can be peeled off within 5 minutes, and the monolayer can be also split within 5 minutes.

During the bending, the strain energy is released upon delamination, considering strain release rate (G) per unit area. As shown in FIG. 5, the moment initiates spalling mode fracture where the cracks propagate downwards due to mixed mode I and mode II fracture. Thus, exfoliation of Ni/2D material stacks can separate the 2D-sapphire interface that has the weakest interfacial toughness, thereby allowing the removal of entire multilayer film from the sapphire wafer.

Figure 6:
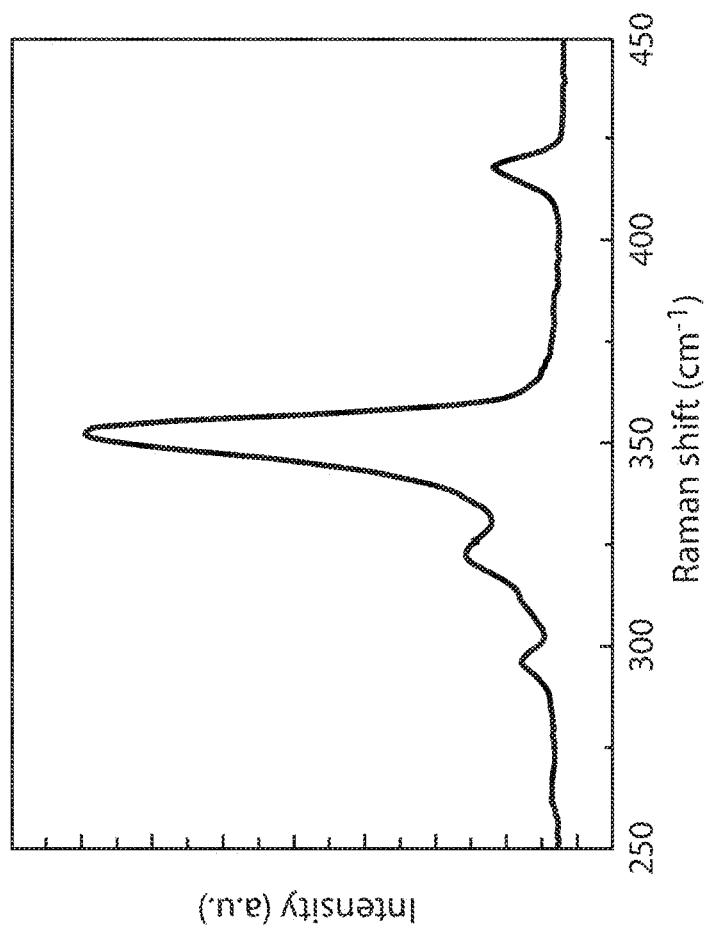
FIG. 6 shows Raman spectroscopy of a 4-nm thick $WS_2$ film as-grown on a sapphire wafer.

FIG. 1C shows a Raman intensity mapping at $E^1_{2g}$ peak (353 cm$^{-1}$) of $WS_2$ grown on a sapphire substrate, with continuous wave laser at a wavelength and power of 532 nm and 2 mW, respectively. FIG. 1D shows AFM topology taken from the top of as-grown 4-nm-thick $WS_2$ on the sapphire wafer. The $WS_2$ (about 4 nm thick) is grown on the sapphire wafer via vapor phase epitaxy (VPE) and characterized each step of the process. As shown in the Raman mapping of as-grown $WS_2$ on the sapphire wafer, the $E^1_{2g}$ peak of the $WS_2$ indicates that the sapphire wafer is fully covered with $WS_2$ after the growth (FIG. 1C, see also FIG. 6). AFM topology taken from the top of the as-grown $WS_2$ (FIG. 1D) shows rough discontinuous surface morphology developed from uncontrollable nucleation during growth, which is typically observed for the as-grown 2D materials.

FIG. 1E shows a Raman intensity mapping at $E^1_{2g}$ peak (353 cm$^{-1}$) on sapphire substrate after exfoliation of a $WS_2$ layer, with laser wavelength and power of 532 nm and 2 mW, respectively. FIG. 1F shows AFM topology taken from the bottom of the $WS_2$ layer after exfoliation. Scale bars for the Raman mapping images and AFM topology images are 100 μm and 50 nm, respectively.

The LRS process includes an exfoliation step to remove the entire $WS_2$ stack from the sapphire wafer, followed by additional exfoliation steps (also referred to as splitting steps) to isolate monolayer films from the multilayer stack. For the first exfoliation, a metal layer (e.g., a 600-nm-thick Ni film) is sputtered on the multilayer $WS_2$ followed by application of thermal release tape on the metal layer as a handler. Lifting off the tape/metal stack can successfully separate the weakest interface (e.g., $WS_2$-sapphire interface), thereby resulting in release of the entire $WS_2$ multilayer film from the substrate. No sign of $WS_2$ is detected from Raman mapping on the sapphire wafer after exfoliation (FIG. 1E). This shows that a moment applied by lift-off supplies strain energy to the Ni/$WS_2$ stacks and the strain energy can delaminate the weakest 2D-sapphire interface. Successful release of the entire $WS_2$ film exposes the bottom side of the $WS_2$ film, thereby providing access to the pristine $WS_2$ layers located at the bottom. As shown in the AFM image taken from the exfoliated surface of $WS_2$ (FIG. 1F), the bottom $WS_2$ layer is continuous and smooth (e.g., root mean square (RMS) roughness is about 0.5 nm) due to complete merging of the nuclei of the initial layers.

To harvest the continuous $WS_2$ monolayer, a second metal layer (e.g., a Ni layer) is formed on the bottom of $WS_2$ film while retaining the top tape/Ni/$WS_2$ stack as-exfoliated (see FIG. 1A). Similar to peeling off the Ni/$WS_2$ stack from the sapphire substrate, a moment from the top Ni can initiate a spalling mode fracture for guiding the cracks downwards. As $\Gamma_{2D-Ni}$ is usually higher than $\Gamma_{2D-2D}$, the cracks arriving near the bottom Ni propagates through weaker $WS_2$-$WS_2$ interface right above the bottom Ni layer. Thus, the Ni/$WS_2$ stack is separated upon peeling while the bottom Ni strongly holds onto the $WS_2$ monolayer (see, e.g., FIG. 5). Consequently, a monolayer of $WS_2$ remains on the bottom Ni. This monolayer film is then transferred onto a host substrate for further processing (e.g., forming a heterostructure).

Figure 2C:
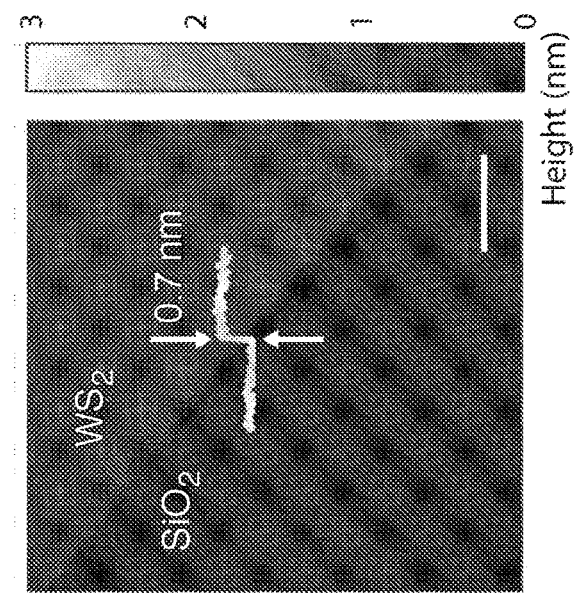
FIG. 2C shows an AFM image and the height profile of the $WS_2$ monolayer on the silica/silicon ($SiO_2$/Si) wafer shown in FIG. 2A.
Figure 2B:
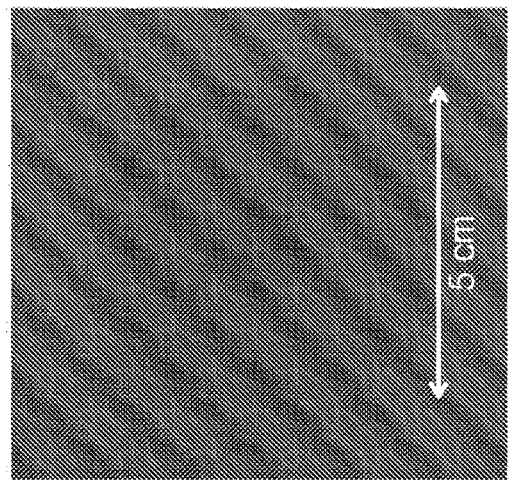
FIG. 2B is a macrograph of a 2-inch wafer-scale $WS_2$ monolayer.
Figure 2A:
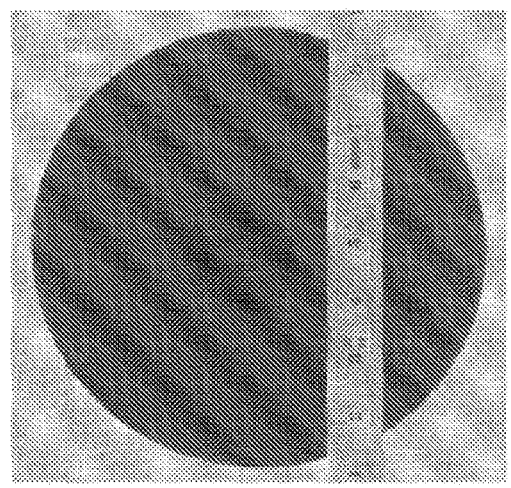
FIG. 2A is an optical image of a 2-inch wafer-scale $WS_2$ monolayer on an 8-inch oxidized silicon (Si) wafer obtained through the LRS process.

FIG. 2A is an optical image of a 2-inch wafer-scale $WS_2$ monolayer on an 8-inch oxidized Si wafer obtained through the LRS process. FIG. 2B is a macrograph of a 2-inch wafer-scale $WS_2$ monolayer. FIG. 2C shows an AFM image and the height profile of the $WS_2$ monolayer transferred on to the $SiO_2$/Si wafer shown in FIG. 2A. The scale bar is 1 μm. FIG. 2D shows representative PL spectra of as-exfoliated 4-nm-thick $WS_2$ and monolayer $WS_2$ obtained by LRS. FIG. 2E shows a wafer-scale PL mapping image at 1.98 eV of $WS_2$ on the $SiO_2$/Si wafer, where the spatial resolution is 2 mm. FIG. 2F shows large-scale (1 mm×1 mm) PL mapping image at 1.98 eV of $WS_2$ on $SiO_2$, where the spatial resolution is 50 µm (see FIG. 8 for 1 µm resolution map). These PL spectra were taken at the same laser power (2 mW) and wavelength (532 nm).

Figure 7:
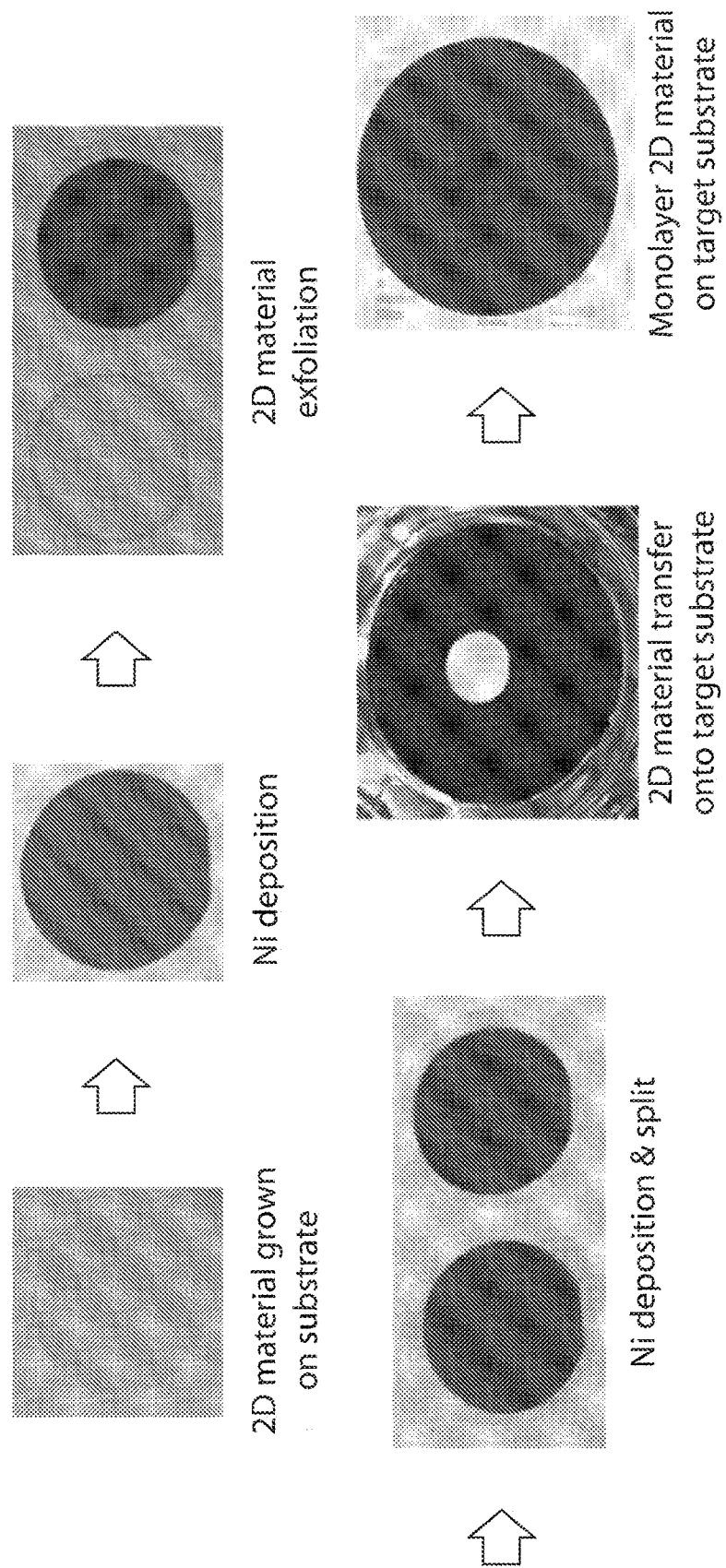
FIG. 7 show images at various steps during a wafer-scale LRS process.

During the characterization, the host substrate includes an 8-inch, 90 nm silicon dioxide ($SiO_2$)-coated silicon (Si) wafer for investigating the thickness and quality of the exfoliated monolayer $WS_2$ film (see, e.g., FIG. 7 for photographs of the entire LRS processes). As shown in FIG. 2A and FIG. 2B, 2-inch, wafer-scale $WS_2$ is well-transferred onto the 8-inch $SiO_2$/Si wafer. AFM topology (FIG. 2C) also clearly indicates that the thickness of the transferred $WS_2$ is equivalent to a monolayer thickness of about 0.7 nm. Successful isolation of $WS_2$ monolayer has also been confirmed by observing indirect-to-direct band gap transition by taking photoluminescence (PL) spectra. As shown in FIG. 2D, isolation of $WS_2$ monolayer via LRS results in substantial enhancement of PL intensity at its direct gap of 1.98 eV. More strikingly, the strong PL intensity originating from the direct band gap transition is uniform across the entire 2-inch wafer area (spatial resolution of 2 mm) as shown in FIG. 2E. PL mapping with finer spatial resolution further proves that LRS yields uniform monolayer thickness (see FIG. 2F for 50 µm resolution map on 1×1 $mm^2$ and FIG. 8 for 1 µm resolution maps on 20×20 $µm^2$). These processes and characterizations are performed at atmospheric pressure and at room temperature.

The LRS process described above can be repeated to produce additional continuous monolayers until, for example, the split layer is no longer continuous. In parallel, an entire 4-nm-thick $WS_2$ film can be transferred from another sapphire substrate onto a 90-nm-thick $SiO_2$-coated Si as a reference for comparison using optical micrographs and scanning electron microscope (SEM) images.

Figure 3K:
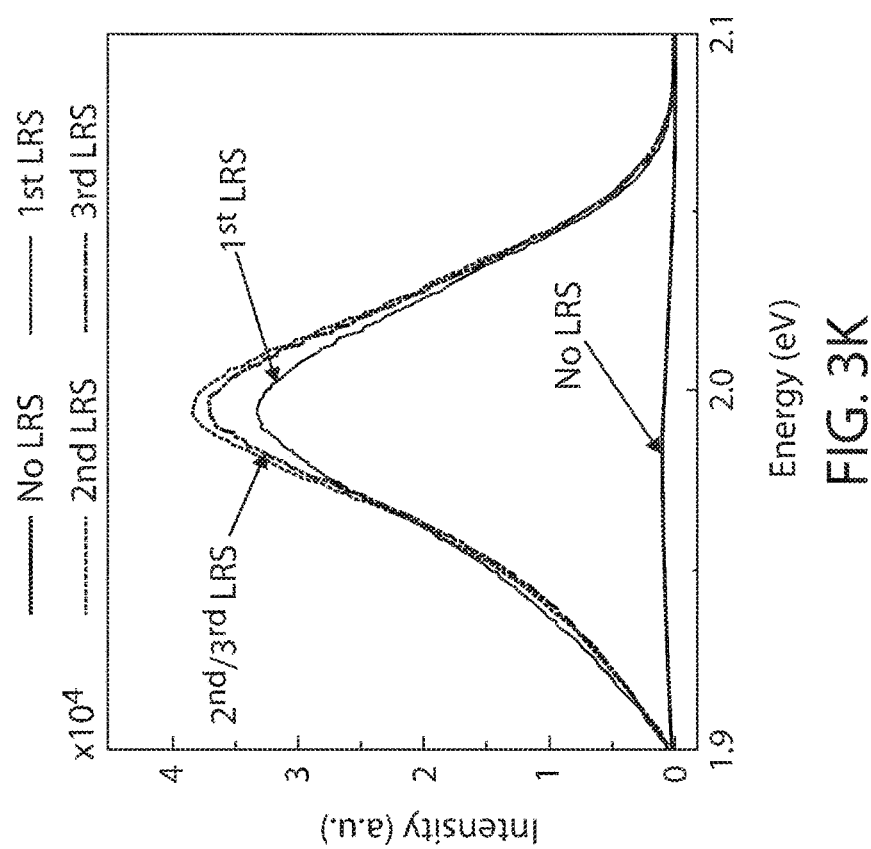
FIG. 3K shows representative PL spectra for as-exfoliated thick $WS_2$ and monolayers of $WS_2$ obtained by first, second, and third LRS processes.

FIG. 3A-FIG. 3J illustrate splitting of a thick 2D material layer into multiple monolayers via LRS. FIG. 3A and FIG. 3B show an optical micrograph and a plan-view SEM image, respectively, of the as-exfoliated thick $WS_2$. FIG. 3C and FIG. 3D show optical micrograph and plan-view SEM image, respectively, of the monolayer of $WS_2$ obtained by a first LRS process. FIG. 3E and FIG. 3F show an optical micrograph and a plan-view SEM image, respectively, of the monolayer of $WS_2$ obtained by a second LRS process. FIG. 3G and FIG. 3H show an optical micrograph and a plan-view SEM image, respectively, of the monolayer of $WS_2$ obtained by third LRS process. FIG. 3I and FIG. 3J show an optical micrograph and a plan-view SEM image, respectively, of the monolayer of $WS_2$ obtained by a last LRS process (i.e., top layer in the multilayer $WS_2$ stack). FIG. 3K shows representative PL spectra for as-exfoliated thick $WS_2$ and monolayers of $WS_2$ obtained by first, second, and third LRS processes. All PL spectra were taken at the same laser power (2 mW) and wavelength (532 nm). Scale bars for optical microscopy images and plan-view SEM images are 50 µm and 400 nm, respectively.

FIG. 3A and FIG. 3B show some non-uniformity in the thickness of the as-exfoliated thick layer (the reference layer). Repetition of LRS allows continuous production of uniform continuous monolayer $WS_2$ (see FIG. 10 for Raman spectra showing right shift for $E^1_{2g}$ peak compared to that of as-exfoliated 4-nm-thick $WS_2$ films) until the third LRS process. As shown in FIG. 3C and FIG. 3H, continuous $WS_2$ monolayers were well collected through LRS processes. After the third LRS process, residual $WS_2$ was observed as discontinuous triangle domains on the top Ni film (see FIG. 3I and FIG. 3J), indicating that the LRS process has reached the final top layer, where nucleations failed to merge during growth. Strong direct gap emission peaks were measured only from the $WS_2$ obtained through the first to third LRS processes, confirming successful monolayer isolation of $WS_2$ from the thick $WS_2$ stack (see FIG. 3K). This is an unprecedented demonstration of 2D material manipulation with single-atom-thickness resolution.

As described above, the LRS technique can be employed to fabricate wafer-scale 2D heterostructures by producing and stacking monolayers of different materials, such as $MoSe_2$, $WSe_2$, and h-BN. As shown in FIG. 11, 3-nm-thick h-BN grown on sapphire was split into three h-BN monolayers. In addition, as shown in FIG. 12, indirect-to-direct band gap transition of $MoSe_2$ and $WSe_2$ after LRS shown by PL measurement proves successful separation of multilayer TMDCs into separate monolayers (see also FIG. 13 and FIG. 14 for optical microscope images and Raman spectra of $MoSe_2$ and $WSe_2$ before and after LRS process). Based on the established LRS process for various 2D materials, various 2D heterostructures can be fabricated.

Figures 4A, 4B:
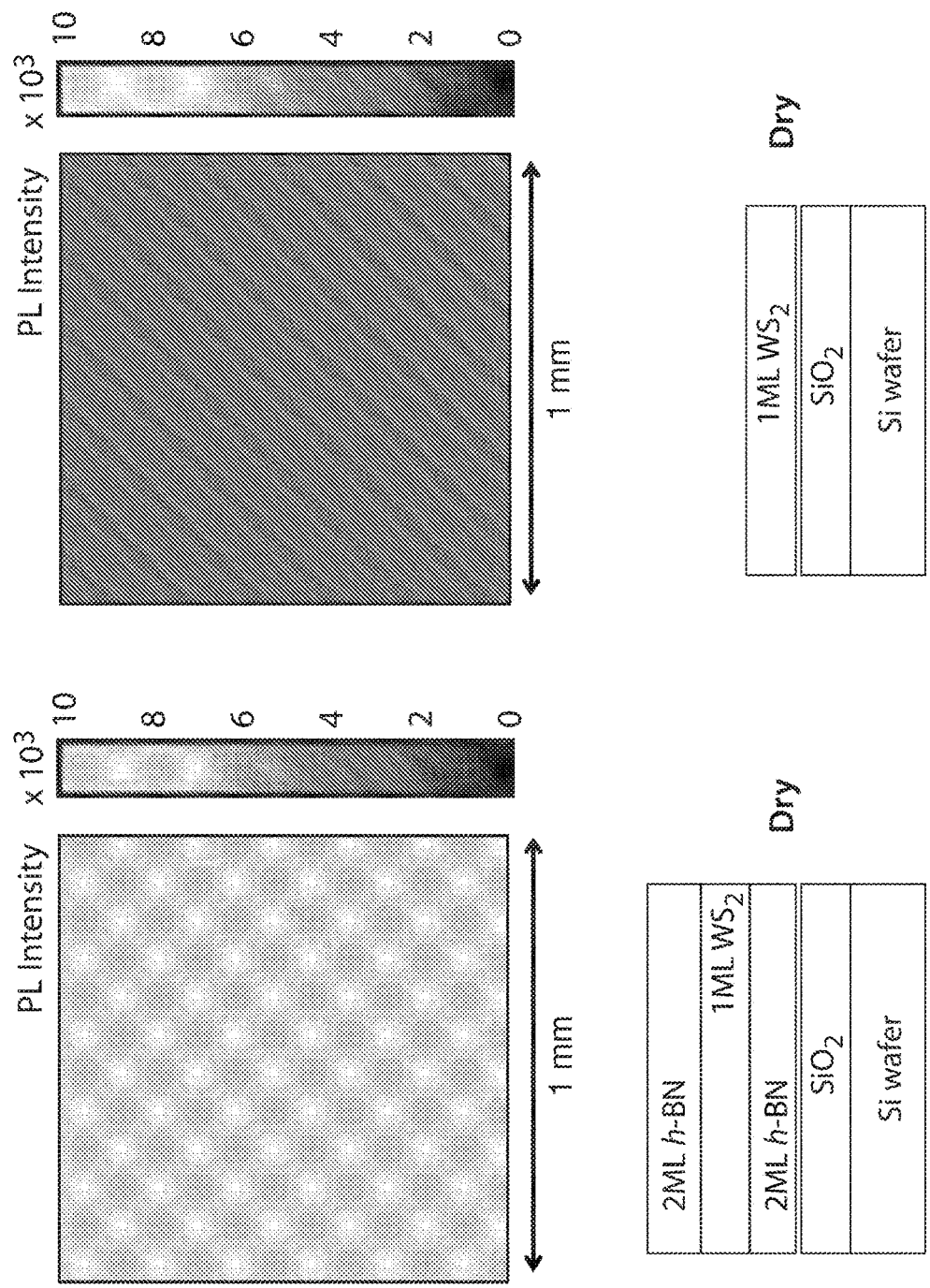
FIG. 4A-FIG. 4D show PL mapping images at 1.98 eV of double-layer (2 ML) hexagonal boron nitride/monolayer (h-BN/monolayer) (1 ML) $WS_2$/2 ML h-BN heterostructure made by dry-stacking 1 ML $WS_2$ on $SiO_2$ made by dry-transfer, 2 ML h-BN/1 ML $WS_2$/2 ML h-BN heterostructure made by wet-stacking, and 1 ML $WS_2$ on $SiO_2$ made by wet-stacking, respectively.
Figures 4C, 4D:
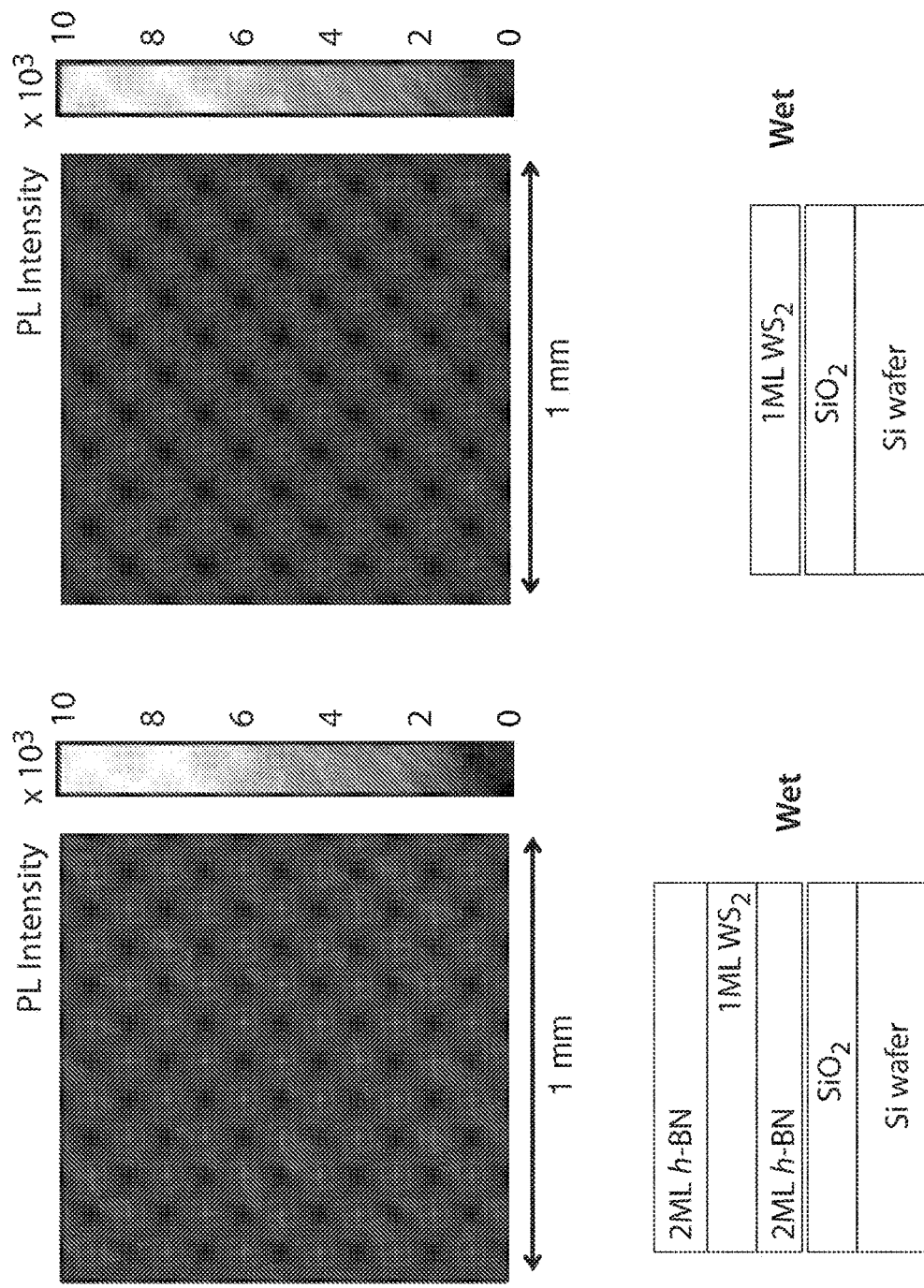
Figure 4E:
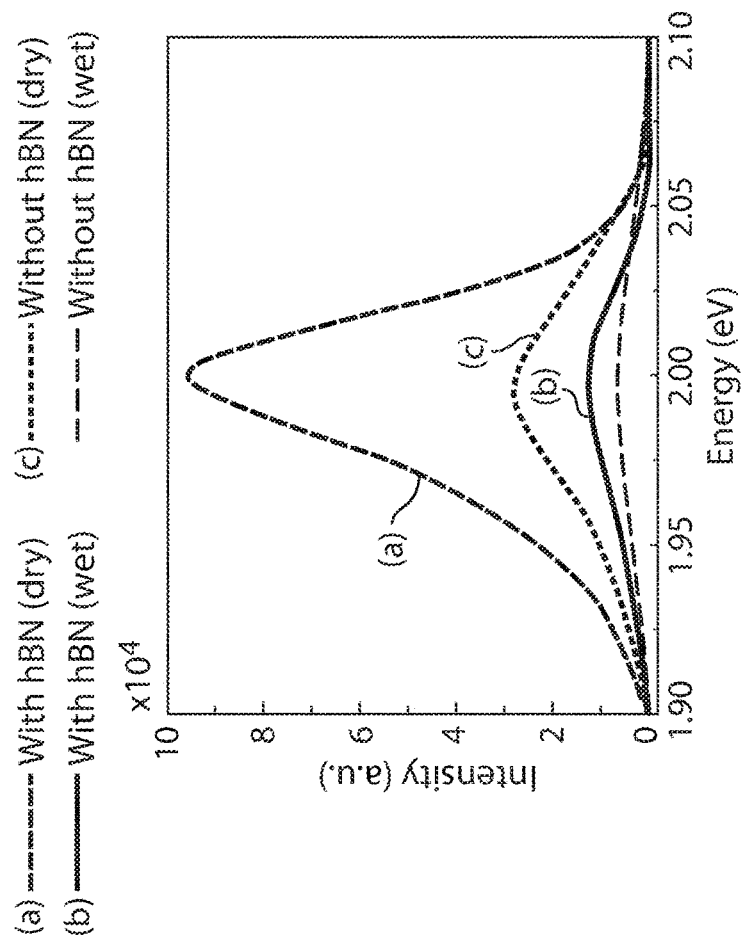
FIG. 4E shows PL spectra of the structures shown in FIG. 4A-FIG. 4D. All PL spectra were taken at the same laser power (2 mW) and wavelength (532 nm).
Figure 4G:
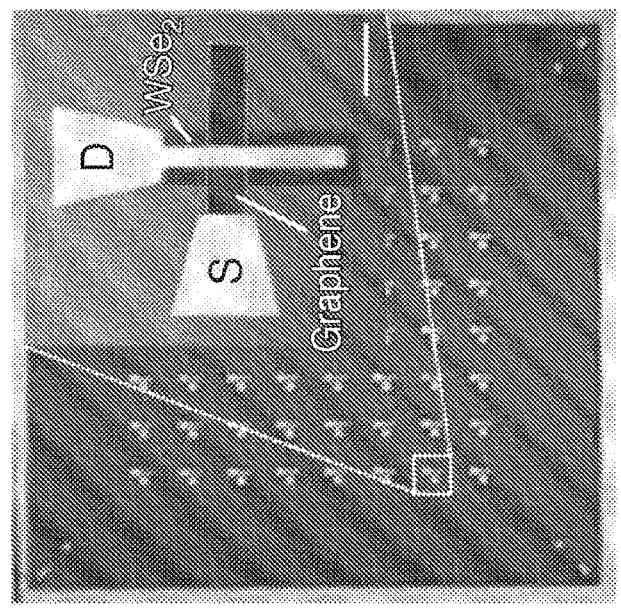
FIG. 4G is a macrograph of 8×8 vertical transistor arrays fabricated using LRS.
Figure 4F:
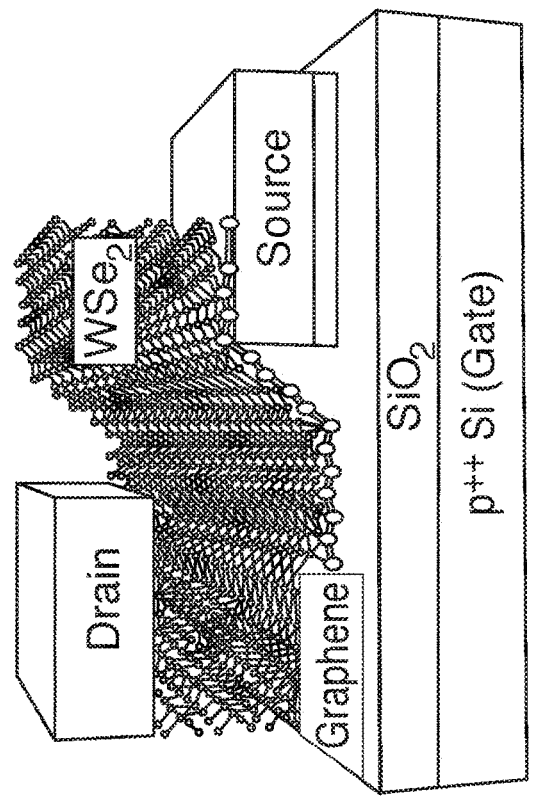
FIG. 4F shows a schematic of a graphene/(tungsten diselenide) (graphene/$WSe_2$) vertical transistor that can be fabricated using the LRS technique.
Figure 4I:
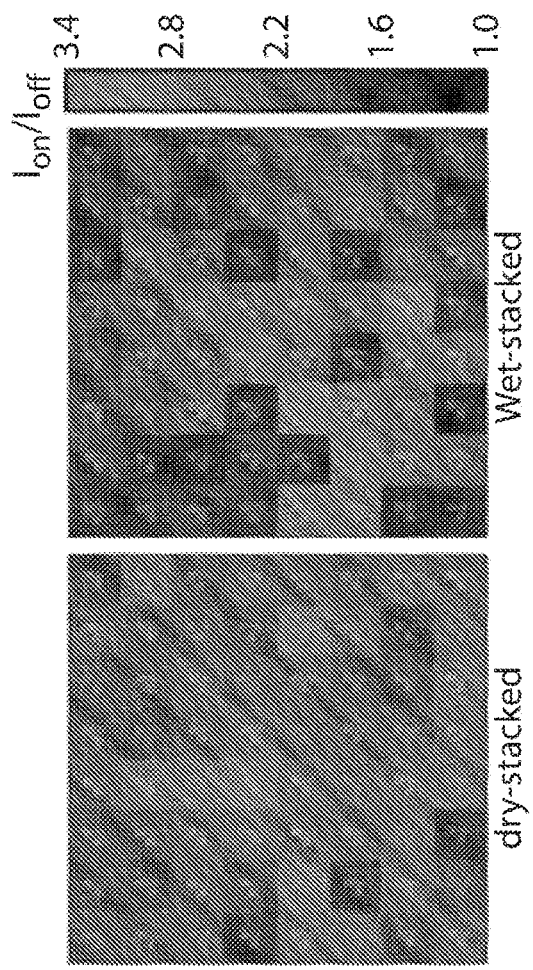
FIG. 4I shows 2D maps of on/off-current ratios extracted from $I_D$-$V_G$ curves at $V_{DS}$=−0.5 V in vertical transistor arrays made by dry-transfer (left) and wet-transfer (right) processes.
Figure 4H:
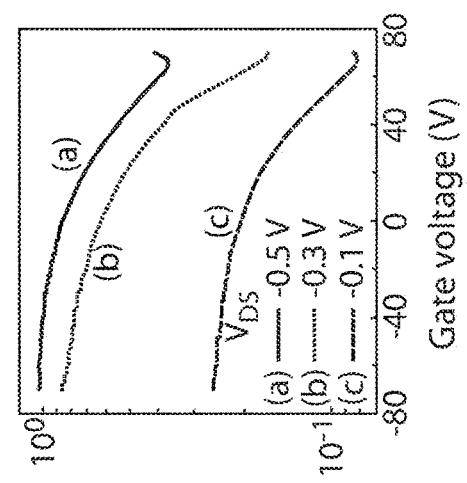
FIG. 4H shows drain current-gate voltage ($I_D$-$V_G$) characteristics at drain-source voltage $V_{DS}$=−0.1 V, −0.3 V, and −0.5 V of one of the transistors shown in FIG. 4F.

FIG. 4A-FIG. 4D show PL mapping images at 1.98 eV of double-layer (2 ML) h-BN/monolayer (1 ML) $WS_2$/2 ML h-BN heterostructure made by dry-stacking, 1 ML $WS_2$ on $SiO_2$ made by dry-transfer, 2 ML h-BN/1 ML $WS_2$/2 ML h-BN heterostructure made by wet-stacking, and 1 ML $WS_2$ on $SiO_2$ made by wet-stacking, respectively. FIG. 4E shows PL spectra of the structures shown in FIG. 4A-FIG. 4D. All PL spectra were taken at the same laser power (2 mW) and wavelength (532 nm). FIG. 4F shows a schematic of graphene/$WSe_2$ vertical transistor. FIG. 4G is a macrograph of 8×8 vertical transistor arrays integrated on a $SiO_2$/Si wafer with 1 cm×1 cm size. The inset shows micrograph of an individual vertical device. The scale bar is 50 µm. The device area is defined by the overlapped region between graphene and drain electrode. FIG. 4H shows $I_D$-$V_G$ characteristics at $V_{DS}$=−0.1 V, −0.3 V, and −0.5 V. FIG. 4I shows 2D color maps of on/off-current ratio extracted from $I_D$-$V_G$ curves at $V_{DS}$=−0.5 V in vertical transistor arrays made by dry-transfer (left) and wet-transfer (right) processes.

The $WS_2$/h-BN heterostructures with the monolayer $WS_2$ sandwiched between h-BN were fabricated to investigate the effect of wafer-scale encapsulation of TMDCs. The presence of h-BN reduces 2D carrier scattering with surface optical phonon effect which can be observed in the flakes of h-BN/TMDC/h-BN heterostructures. Monolayer h-BN prepared by LRS was dry-transferred twice on a $SiO_2$/Si wafer followed by monolayer transfer of $WS_2$ on top, and capped by double-layer of dry-transferred h-BN for encapsulation (see FIG. 16 for the schematic description of 2D heterostructure via LRS process). Substantial enhancement of PL intensity was observed uniformly across the wafer (1 $mm^2$ PL map shown in FIG. 4A and measured across the wafer with same PL results), compared to that of a $WS_2$ monolayer directly transferred onto $SiO_2$ (see FIG. 4B). The dry-stacking method can help achieve optoelectronic enhancement in TMDCs by h-BN encapsulation as the process preserves the quality of the 2D materials.

The h-BN/$WS_2$/h-BN heterostructures can also be fabricated using a wet-stacking process by scooping 2D materials from a solution. Weakened PL response were observed compared to that of heterostructures prepared by the dry-stacking process (see FIG. 4C). This may be attributed to interference from poly(methyl methacrylate) (PMMA) residues at the interface (see FIG. 17). Representative PL spectra for monolayer $WS_2$ on $SiO_2$, and double-layer h-BN/monolayer $WS_2$/double-layer h-BN prepared by dry- and wet-stacking are shown in FIG. 4E. Degradation of the PL intensity was observed for the wet-stacked h-BN/$WS_2$ heterostructure compared to dry-transferred $WS_2$ on $SiO_2$. 15 times enhancement of PL intensity was observed for h-BN/WS$_2$/h-BN dry-stacks compared to that for WS$_2$ wet-stacks on SiO$_2$ (see FIG. 4D). These characterizations reveal wafer-scale enhancement in optoelectronic quality of monolayer WS$_2$ by wafer-scale h-BN encapsulation. Therefore, the LRS technique described herein can be used for fabricating large scale optoelectronic devices based on van der Waals heterostructures.

Applying the "wafer-scale dry-stacking technique" also produces arrays of 2D heterostructure devices at the wafer scale, and these heterostructure arrays exhibit excellent uniformity of device performance across the wafer. For example, arrays of WSe$_2$/graphene vertical transistors were fabricated and characterized. First, monolayer epitaxial graphene grown on silicon carbide (SiC) and 3-nm-thick WSe$_2$ grown on sapphire were exfoliated from the substrate. Then, they were dry-stacked on 100-nm-thick SiO$_2$/p$^{++}$ Si wafer, where SiO2 and p++ Si were utilized as gate oxide and back gate, respectively (see FIG. 4F for the schematics of a vertical transistor structure).

FIG. 4G shows an optical image of the 8×8 arrays of WSe$_2$/graphene vertical transistors made on a 1 cm×1 cm wafer. The vertical transistor arrays operate at low drain-source voltages ($V_{DS}$) as observed in vertical transistors made from exfoliated flakes. FIG. 4H shows representative drain current-gate voltage ($I_D$-$V_G$) curves at $V_{DS}$=−0.1 V, −0.3 V, and −0.5 V (see FIG. 18 for drain current-drain voltage ($I_D$-$V_D$) curves of the vertical transistors). The transistors exhibit an on/off-current ratio of about 3.2 at a $V_{DS}$ value of about −0.5 V and the performance is comparable to that observed in other flake-based vertical transistors at the same 3-nm thickness of TMDCs (see FIG. 19 for energy band diagrams of graphene/WSe$_2$ heterojunction under positive and negative gate voltages).

A total of 64 arrays of WSe$_2$/graphene vertical transistors (8×8) on a wafer was investigated and they exhibit excellent uniformity across the wafer. As shown in the map of on/off ratio of vertical transistors (FIG. 4I), these transistor arrays show excellent device-to-device uniformity with 9.6% variation (see FIG. 20 for the statistical distribution). This is in clear contrast to the performance of vertical transistor arrays fabricated by the wet-stacking process where device-to-device variation is 26%. For h-BN/WS$_2$ heterostructures, such uniform device performance can be attributed to the cleanliness of the dry-stacking process because PMMA is not introduced at the interfaces during the process, as in the case of wet-stacking process, where the residue can prohibit the modulation of the graphene Fermi level (see FIG. 17). This observation can be used to manufacture wafer-scale 2D material-based arrays and circuitry, where high yield and uniform device performances across the wafer are desirable.

Figure 4K:
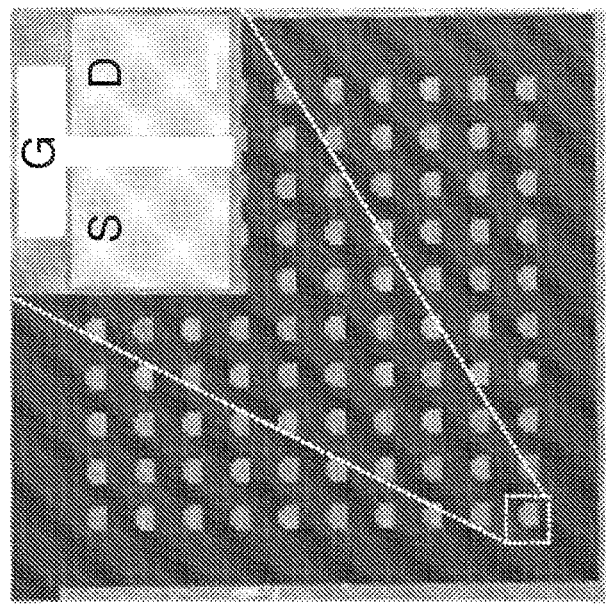
FIG. 4K is a macrograph of 10-by-10 FET arrays integrated on a $SiO_2$/Si wafer with 1-cm-by-1-cm size (Inset shows micrograph of an individual device. Scale bar: 100 mm). In certain embodiments, the device area is defined by the gap between source (S) and drain (D) electrodes. "G" indicates gate.
Figure 4J:
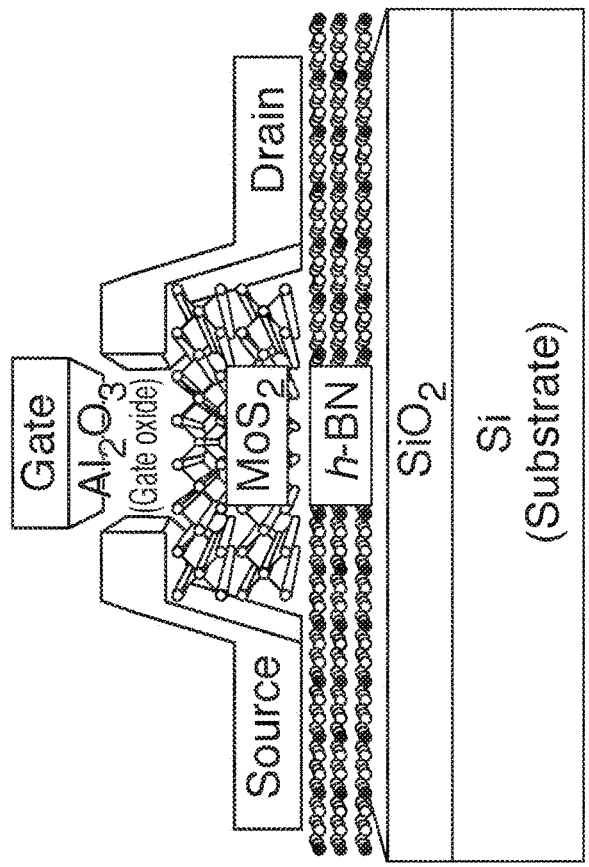
FIG. 4J is a schematic of a $MoS_2$-based field effect transistor (FET).
Figure 4L:
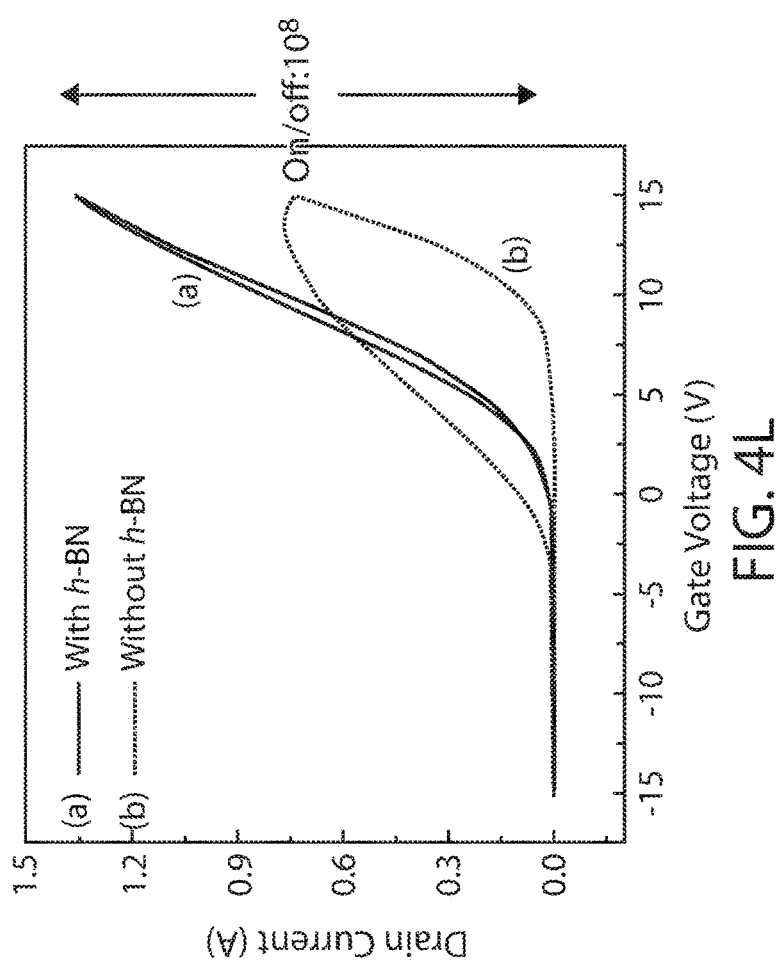
FIG. 4L shows representative drain current-gate voltage ($I_D$-$V_G$) characteristics of $MoS_2$-based FETs at drain-source voltage ($V_{DS}$)=1 V.
Figure 4M:
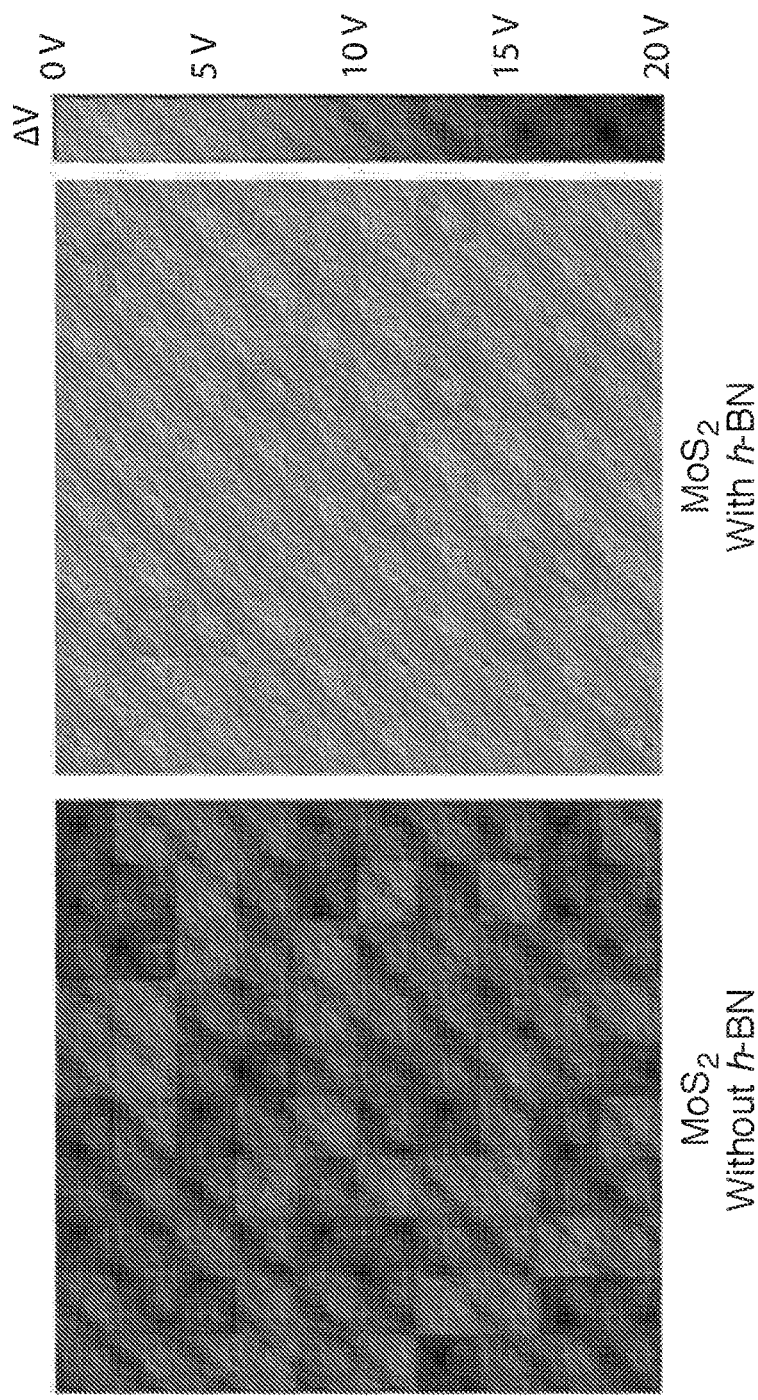
FIG. 4M shows 2D color maps of hysteresis voltage extracted from $I_D$-$V_G$ curves at $V_{DS}$=1 V in transistor arrays made without h-BN (left) and with h-BN (right).

FIG. 4J is a schematic diagram of a structure of a 2D heterostructure device. Deleterious trap charges from the substrate were avoided, e.g., by using h-BN. FIG. 4K shows an optical image of 10-by-10 arrays of MoS$_2$ FETs on a 1-cm$^2$ wafer. Substantial suppression of hysteresis has been observed in FETs with h-BN (e.g., FIG. 4L). This reduction of hysteresis was obtained uniformly across the arrays in the wafer. As shown in the map of hysteresis of FETs with and without h-BN, the FET arrays with h-BN showed excellent reduction in hysteresis during a gate voltage sweep applied uniformly across the wafer (FIG. 4M).

Figure 5A:
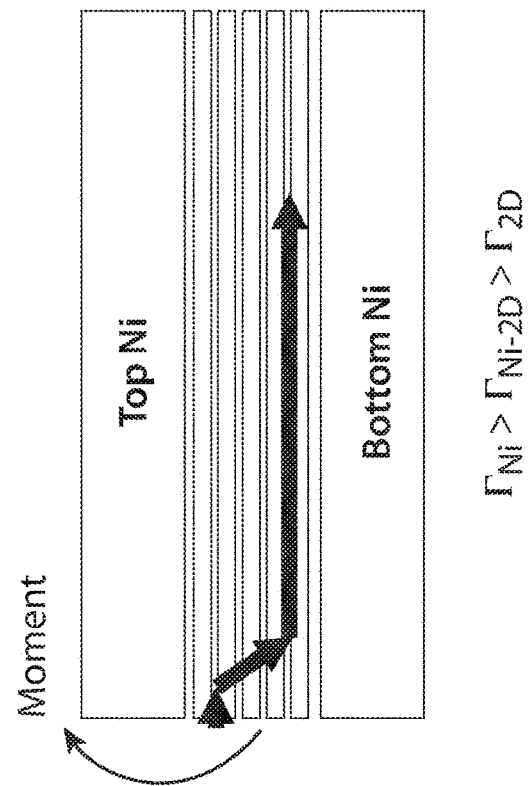
FIG. 5A and FIG. 5B illustrate crack progression during the LRS process.
Figure 5B:
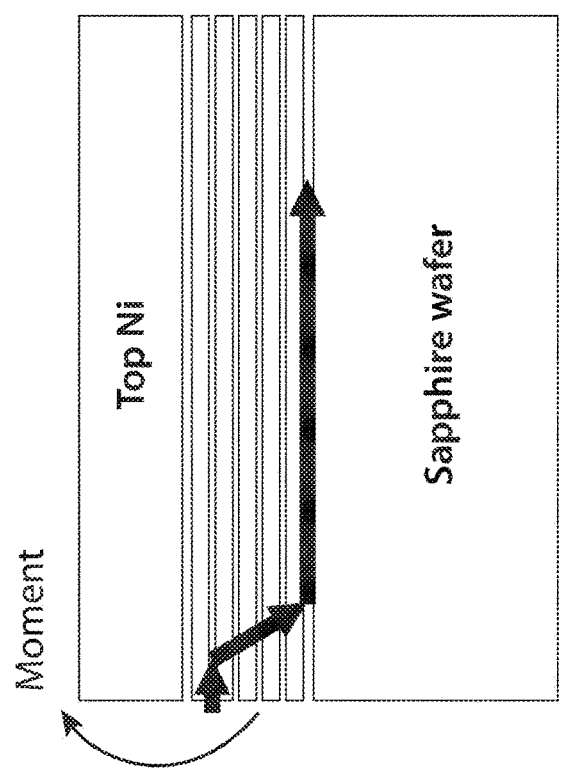

FIG. 5A and FIG. 5B illustrate crack progression during the layer-resolved splitting (LRS) process. FIG. 5A illustrates first exfoliation of entire 2D materials from a sapphire wafer. FIG. 5B illustrates exfoliation of the bottom monolayer 2D material. The cracks propagate downwards due to mixed mode I and mode II fracture mechanisms. 2D materials grown at the edge of the wafer may be defective so that the crack propagation can be facilitated. Spalling mode fracture occurs due to the external bend moment applied. In addition to the opening mode stress (mode I) acting on the crack tip, a shear field (mode II) is created to guide the cracks into the bulk. Thus, an initiated crack propagates downwards and advances lateral at the weakest interface. Energy release rate (G) in FIG. 1B is calculated according to applied moment value per unit width with each interfacial toughness information with the following equation.

$$G=M^2/(2EI) \tag{1}$$

where M and E are respectively moment and Young's modulus, and I is described by the equation: $I=H_f^3/12$ and $H_f$ is Ni thickness.

FIG. 6 shows Raman spectroscopy of a 4-nm thick WS$_2$ film as-grown on a sapphire wafer. The laser wavelength and power is 532 nm and 2 mW in continuous waveform, respectively.

FIG. 7 show images at various steps during a wafer-scale LRS process. These images include top-view images of a thick layer of 2D material (e.g., WS$_2$) grown on a sapphire substrate, a Ni layer deposited on the thick layer of 2D material, exfoliation of the entire thick layer, another Ni layer deposited on the bottom side of the thick layer, monolayer produced from LRS, and monolayer after being transferred to a target substrate.

Figure 8:
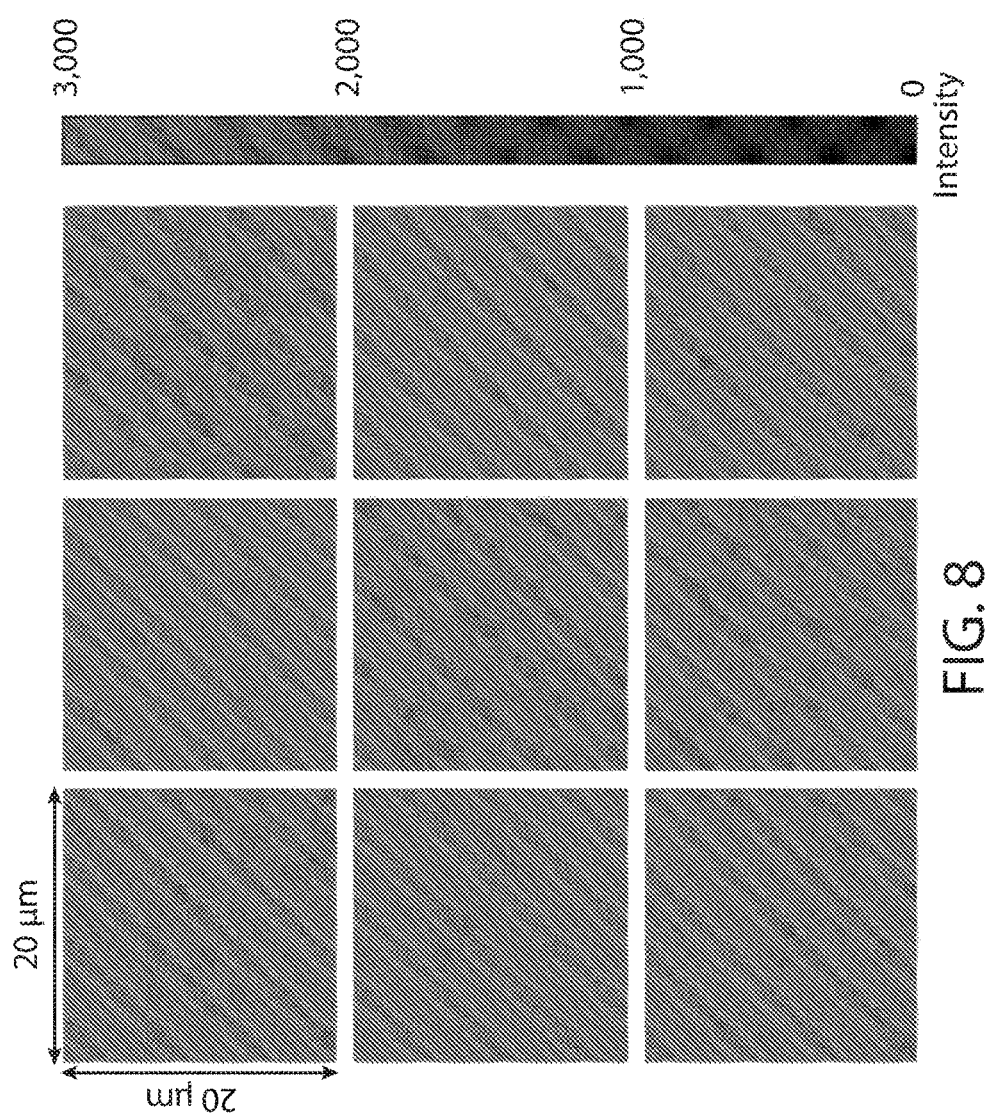
FIG. 8 shows high-resolution PL mapping of a $WS_2$ monolayer.
Figures 9A, 9B:
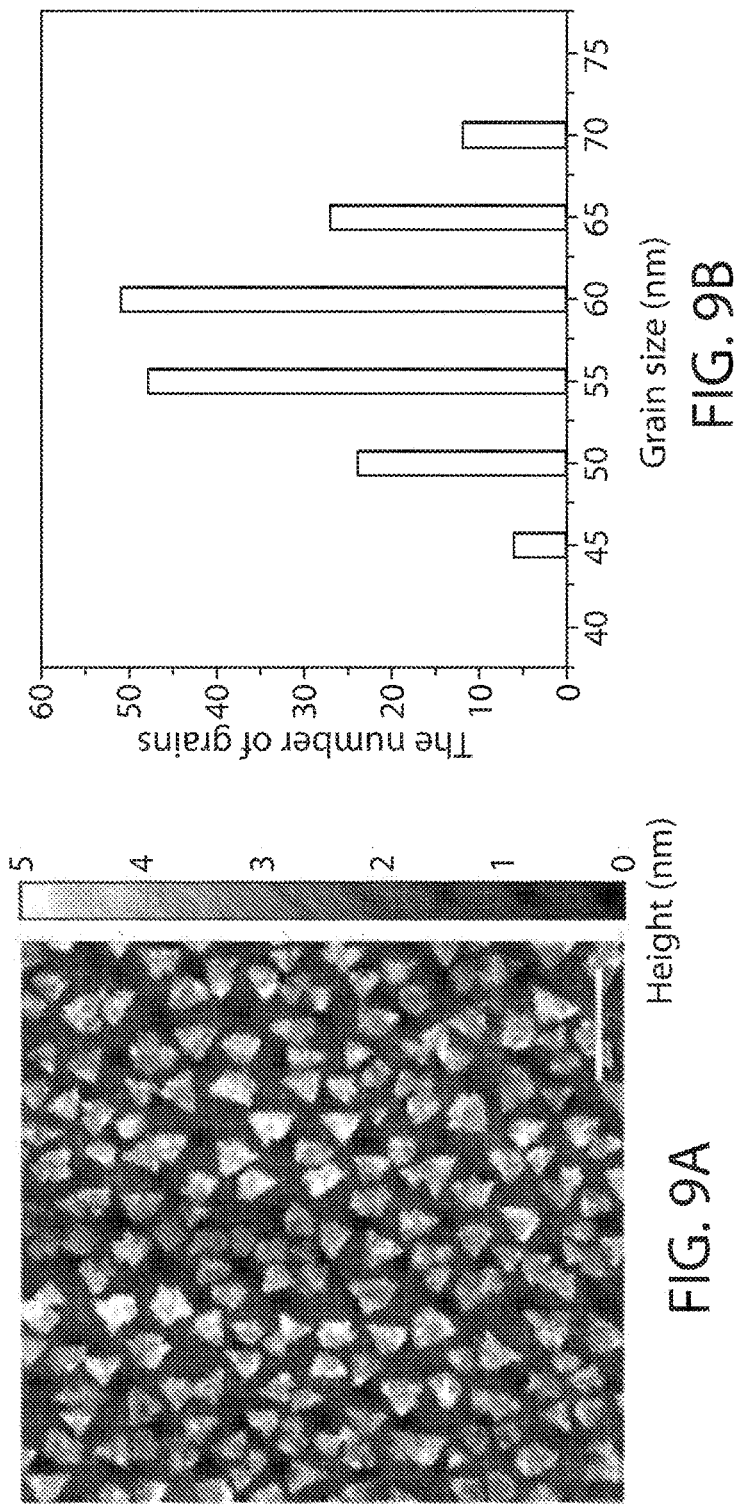
FIG. 9A shows an AFM image that shows grain morphology of $WS_2$. Scale bar: 200 nm.
FIG. 9B shows grain size distribution of $WS_2$ extracted from the AFM image of FIG. 9A. It was assumed that each grain was merged together without additional nucleation. Based on the assumption, the number of grains was counted for each size.

FIG. 8 shows high-resolution PL mapping of a WS$_2$ monolayer. PL mapping images with area of 20 μm×20 μm at 1.98 eV for monolayer WS$_2$ transferred on SiO$_2$, where the spatial resolution is 1 about μm. PL was taken with the same laser power of 2 mW in continuous waveform and wavelength of 532 nm.

Figure 10:
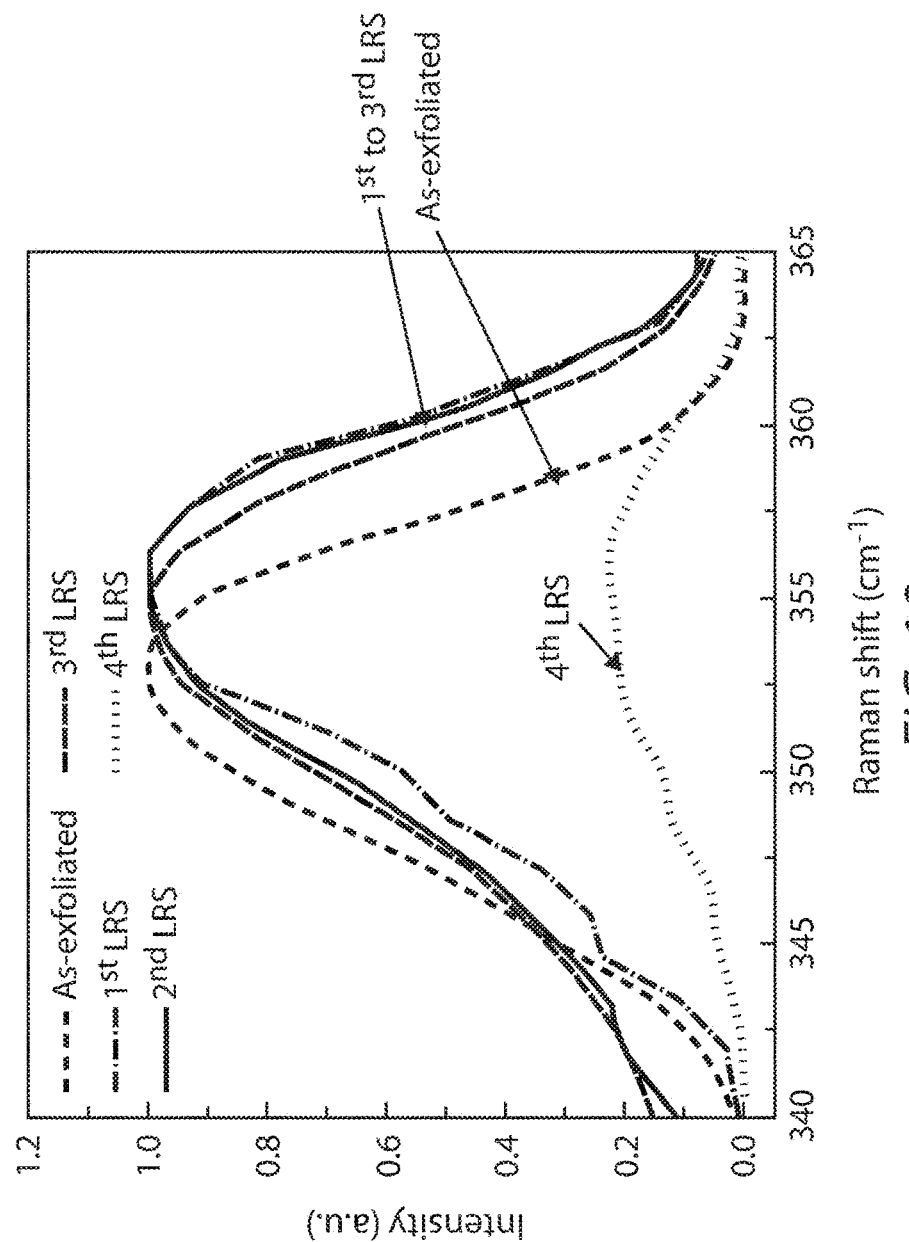
FIG. 10 shows Raman characteristics of $WS_2$ films obtained through LRS process.
Figure 11A:
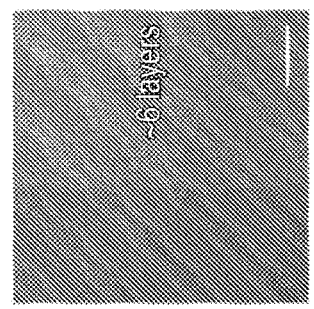
FIG. 11A-FIG. 11H illustrate splitting of h-BN into monolayer using the LRS technique.
Figure 11B:
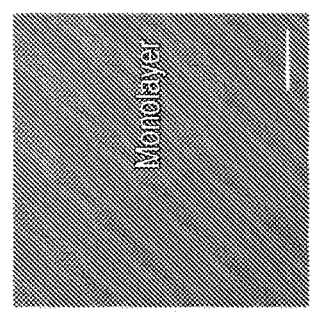
Figure 11C:
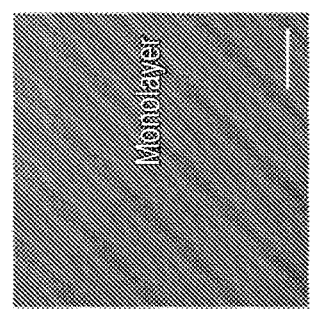
Figure 11D:
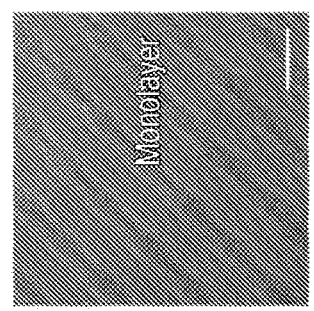
Figure 11E:
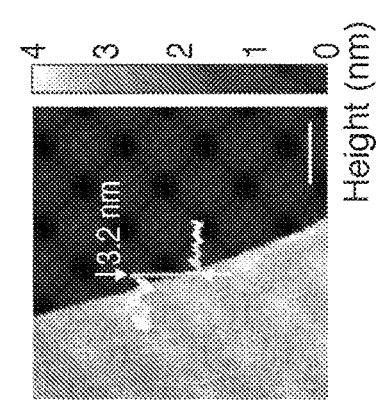
Figure 11F:
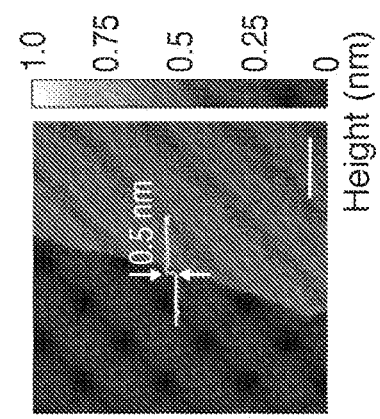
Figure 11G:
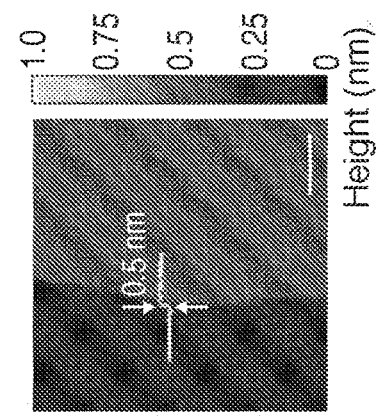
Figure 11H:
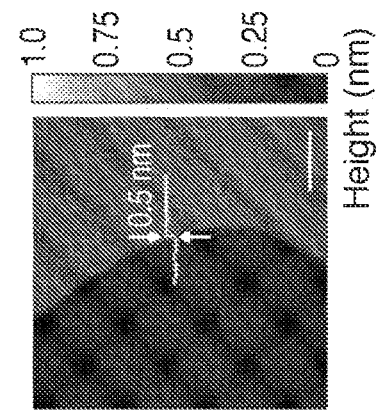

FIG. 10 shows Raman characteristics of WS$_2$ films obtained through LRS process. Representative Raman spectra are shown for as-exfoliated thick WS$_2$, monolayers of WS$_2$ obtained by first, second, third, and fourth LRS processes.

FIG. 11A-FIG. 11H illustrate splitting of h-BN into monolayer using the LRS technique. FIG. 11A-FIG. 11D show optical microscopy images for as-exfoliated thick h-BN, monolayers of h-BN obtained by first, second, and third LRS processes. FIG. 11E-FIG. 11H show AFM images with height profiles of h-BN films for as-exfoliated thick h-BN, monolayers of h-BN obtained by first, second, and third LRS processes. Scale bars for optical microscopy images and AFM images are 50 μm and 1 μm, respectively.

Figure 12C:
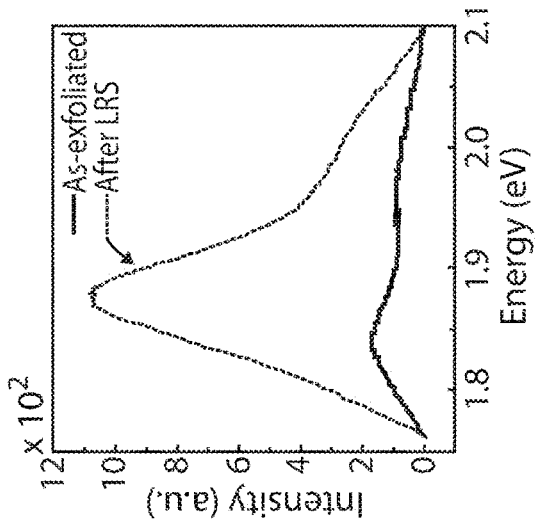
FIG. 12C shows PL characteristics of $MoS_2$ films before and after LRS processes.
Figure 12B:
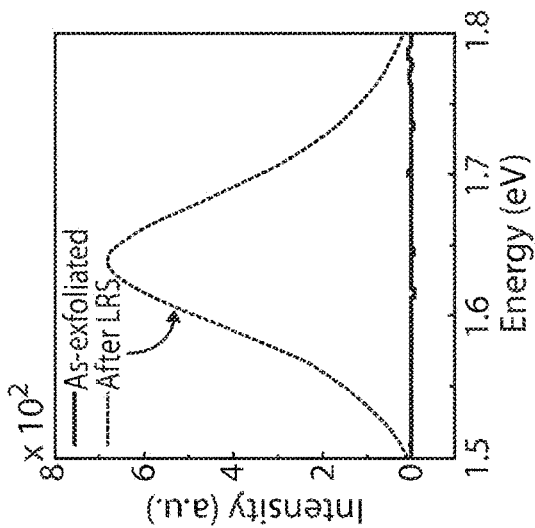
FIG. 12A-FIG. 12B show PL characteristics of molybdenum diselenide ($MoSe_2$) and $WSe_2$ films, respectively, before and after LRS processes.
Figure 12A:
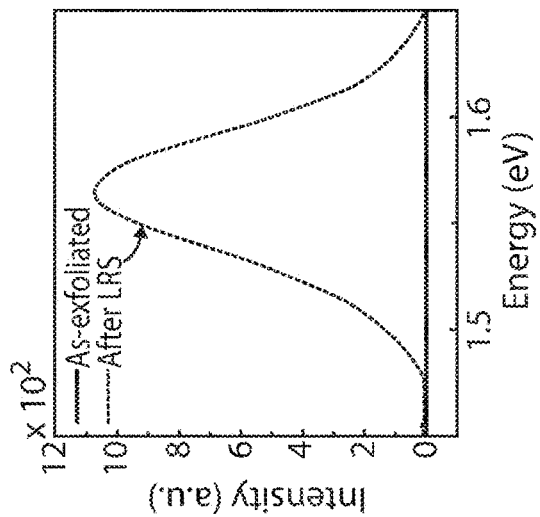

FIG. 12A-FIG. 12B show PL characteristics of MoSe$_2$ and WSe$_2$ films, respectively, before and after LRS processes. FIG. 12A shows PL spectra for as-exfoliated thick MoSe$_2$ and monolayer MoSe$_2$ obtained by LRS process. FIG. 12B shows PL spectra for as-exfoliated thick WSe$_2$ and monolayer WSe$_2$ obtained by LRS process. All PL spectra were taken with the same laser power of 2 mW in continuous waveform and wavelength of 532 nm.

FIG. 12C shows PL characteristics of MoS$_2$ films before and after LRS processes. FIG. 12C shows representative PL spectra for as-exfoliated thick MoS$_2$ and monolayer MoS$_2$ obtained by LRS process. The MoS$_2$ exhibits a strong direct transition emission peak at the energy of 1.88 eV after LRS process, but weak and wide PL signal with red shift (from 1.88 eV to 1.84 eV) is observed in the as-exfoliated MoS$_2$ before LRS process.

Figure 13E:
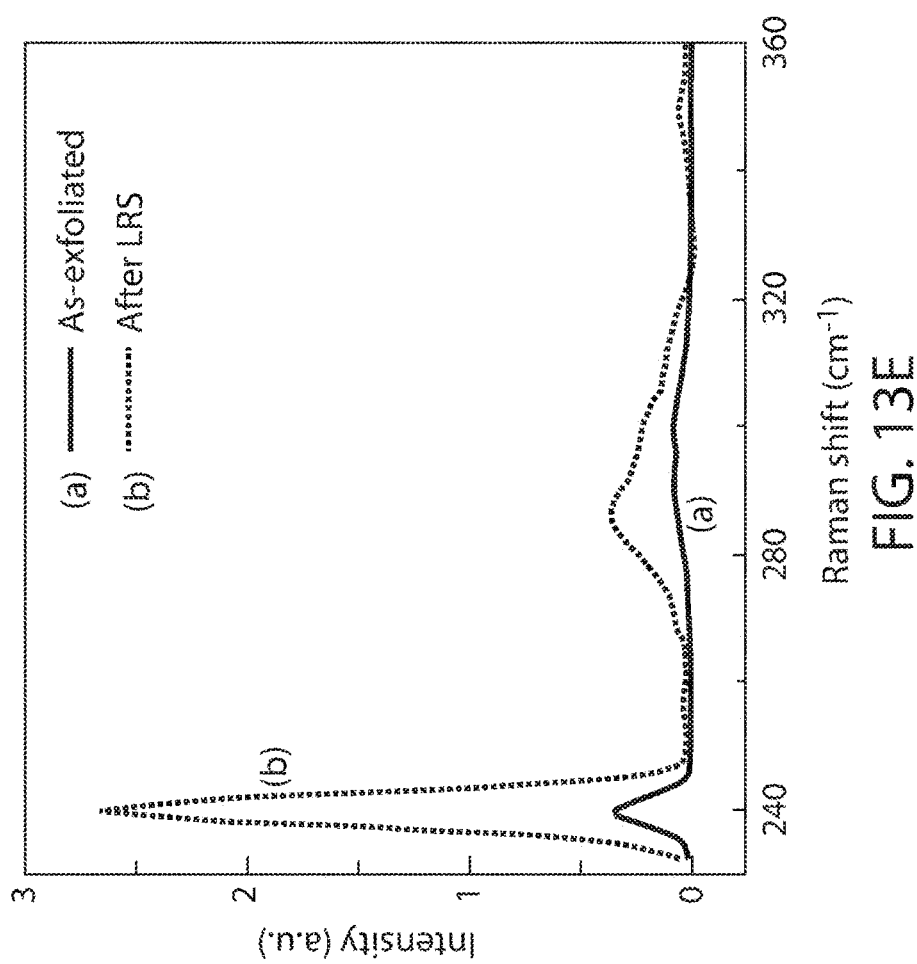

FIG. 13A-FIG. 13E illustrate splitting of MoSe$_2$ into monolayer using LRS technique. FIG. 13A and FIG. 13B show Optical microscopy images for as-exfoliated thick MoSe$_2$ and monolayer MoSe$_2$ obtained by LRS process, respectively. FIG. 13C and FIG. 13D show AFM images with height profiles for as-exfoliated thick MoSe$_2$ and monolayer MoSe$_2$ obtained by LRS process, respectively. Scale bars for optical microscopy images and AFM images are 50 µm and 1 µm, respectively. FIG. 13E shows Raman spectra for as-exfoliated thick MoSe$_2$ and monolayer MoSe$_2$ obtained by LRS process.

Figure 14E:
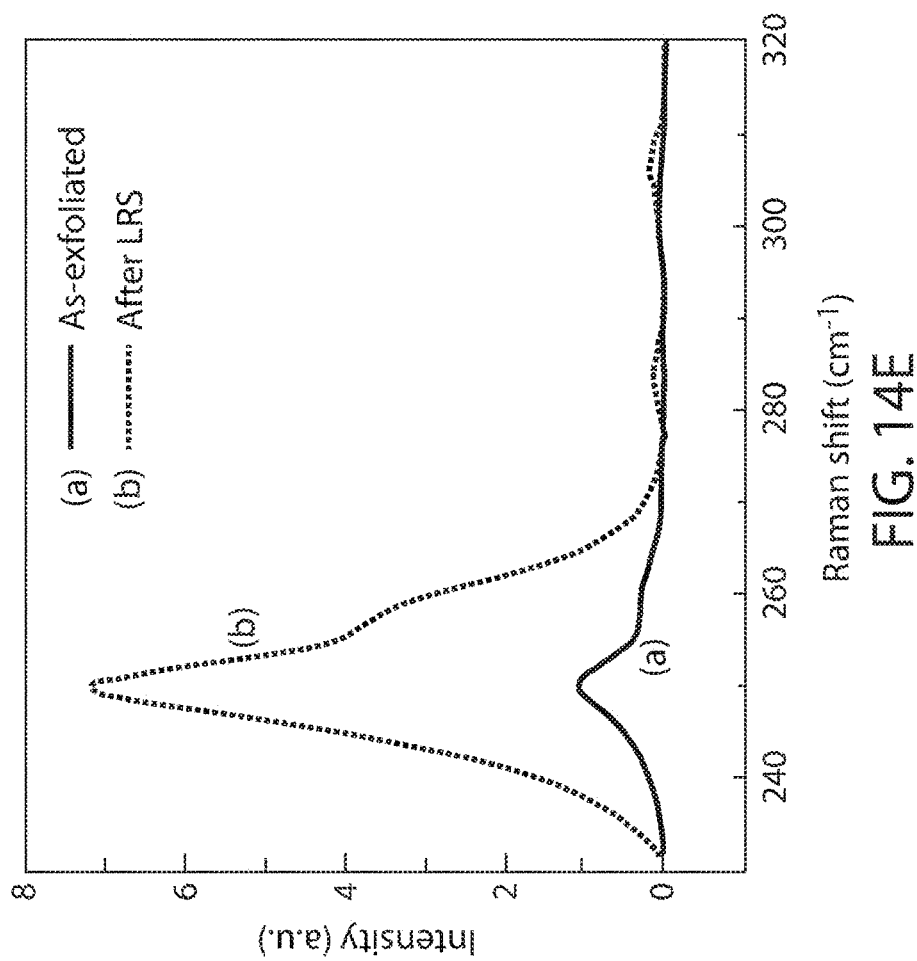

FIG. 14A-FIG. 14E illustrate splitting of WSe$_2$ into monolayer using LRS technique. FIG. 14A and FIG. 14B show optical microscopy images of as-exfoliated thick WSe$_2$ and monolayer WSe$_2$ obtained by LRS process, respectively. FIG. 14C and FIG. 14D show AFM topology images with height profiles of as-exfoliated thick WSe$_2$ and monolayer WSe$_2$ obtained by LRS process, respectively. Scale bars for optical microscopy images and AFM images are 50 µm and 1 µm, respectively. FIG. 14E shows Raman spectra for as-exfoliated thick WSe$_2$ and monolayer WSe$_2$ obtained by LRS process.

Figure 15E:
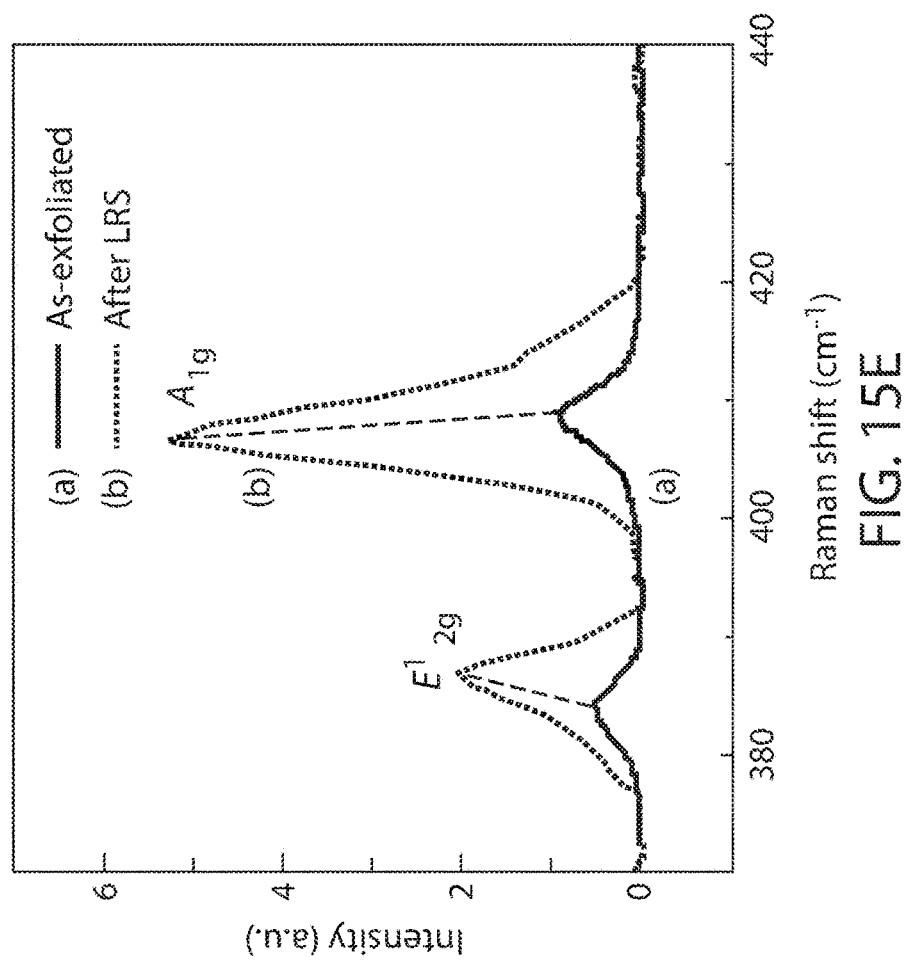

FIG. 15A-FIG. 15E show data for the split of MoS$_2$ into monolayer using LRS technique. FIG. 15A-FIG. 15B show optical microscopy images and FIG. 15C-FIG. 15D show AFM images with height profiles, for as-exfoliated thick MoS$_2$ (FIG. 15A) and (FIG. 15C), and monolayer MoS$_2$ obtained by LRS process (FIG. 15B) and (FIG. 15D). Scale bars for optical microscopy images and AFM images are 50 µm and 1 µm, respectively. FIG. 15E shows representative Raman spectra for as-exfoliated thick MoS$_2$ and monolayer MoS$_2$ obtained by LRS process. The Raman spectrum for MoS$_2$ included two prominent peaks at 384 cm$^{-1}$ and 409 cm$^{-1}$ correspond to the E$^1_{2g}$ and the A$_{1g}$ phonon modes. After LRS process, the A$_{1g}$ and E$^1_{2g}$ modes underwent a blue shift (from 409 cm$^{-1}$ to 406 cm$^{-1}$) and a red shift (from 384 cm$^{-1}$ to 387 cm$^{-1}$) with strong Raman signal by weakening of the van der Waals forces.

Figure 16:
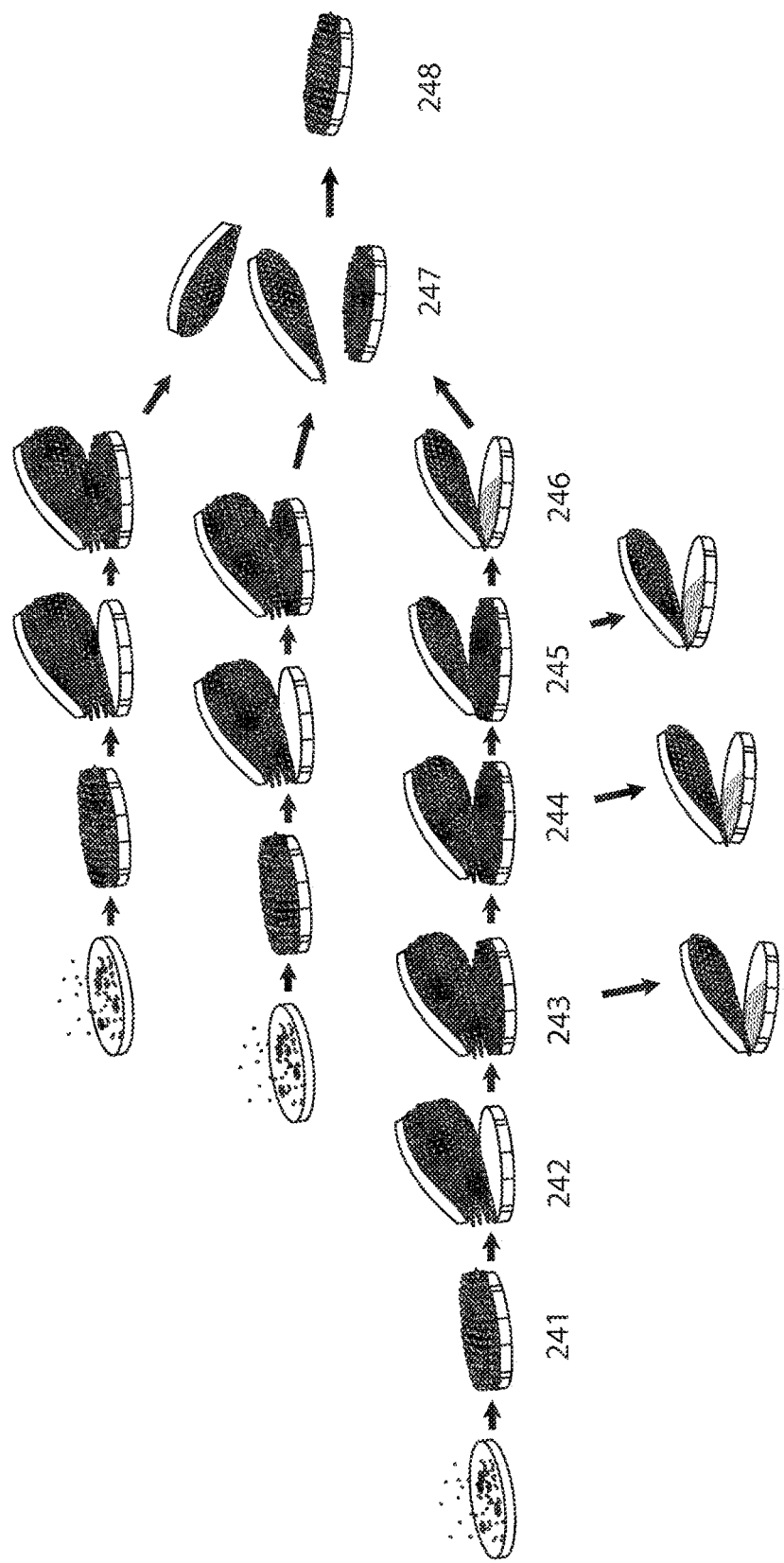
FIG. 16 illustrates a method of fabricating a 2D heterostructure via LRS.

FIG. 16 illustrates a method of fabricating 2D heterostructure via LRS process. The flow diagram shows the fabrication of the 2D heterostructure using monolayer 2D materials obtained through LRS process. For example, step 241 of FIG. 16 illustrates the growth of a 2D material on a substrate. Step 242 of FIG. 16 illustrates exfoliation of the 2D material from the substrate using a metal layer (e.g., a Ni layer). Step 243 of FIG. 16 illustrates a first split into a monolayer from the 2D material. Step 244 of FIG. 16 illustrates a second split into a second monolayer from the remaining 2D material. Step 245 of FIG. 16 illustrates a third split into a third monolayer from the remaining 2D material. Step 246 of FIG. 16 illustrates transfer onto a target substrate of a monolayer from the 2D material. Step 247 of FIG. 16 illustrates stacking of 2D materials to form a 2D heterostructure 248. Examples of heterostructures that can be produced via this method include quantum well structure-based LEDs (e.g., graphene/h-BN/WS$_2$/h-BN/graphene), solar cells based on hetero-PN-junction (e.g., MoS$_2$/WSe$_2$), resonant tunneling diode (e.g., graphene/h-BN/MoS$_2$/h-BN/graphene), vertical transistors (e.g., graphene/WSe$_2$), and memory (e.g., graphene/h-BN/MoS$_2$).

FIG. 17A-FIG. 17D show comparison of dry LRS process with wet transfer process. FIG. 17A and FIG. 17B show AFM topology images of monolayer graphene transferred on oxidized Si wafer with dry LRS process (e.g., using nickel handling film) and wet-transfer process (e.g., in HF solution using PMMA handling film), respectively. FIG. 17C and FIG. 17D show height profiles of monolayer graphene transferred on oxidized Si wafer with dry LRS process and wet transfer process, respectively. Scale bar for the AFM images is 500 nm.

Figure 18:
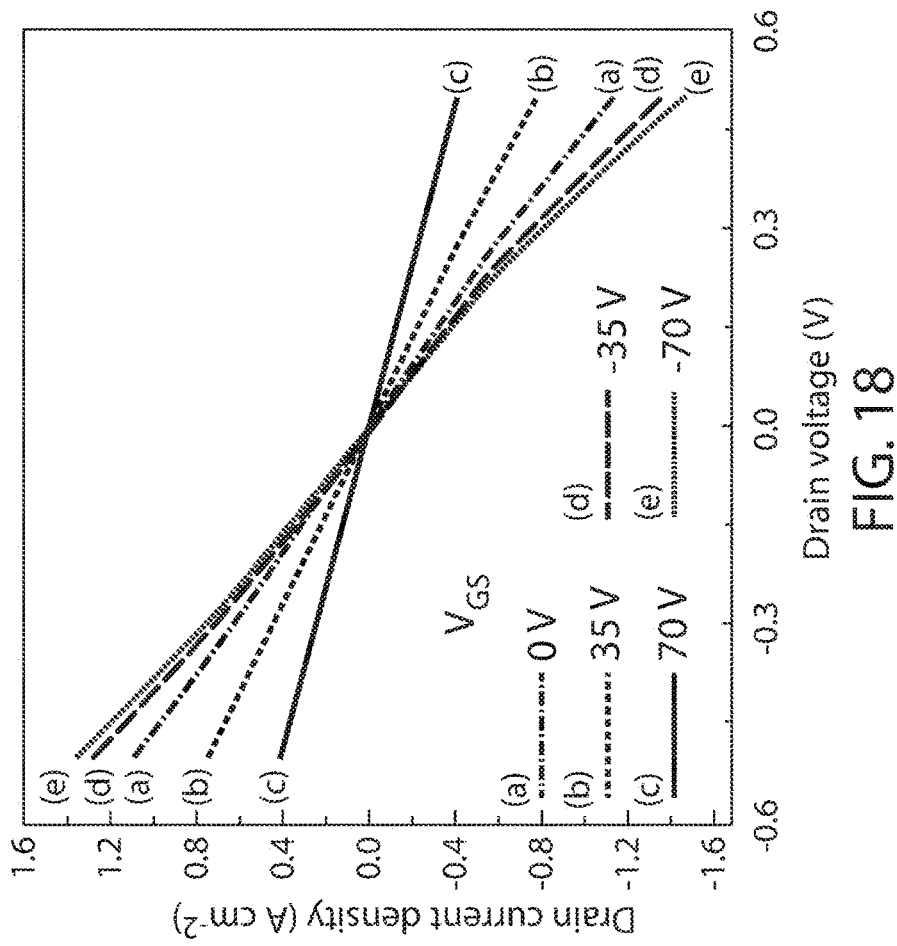
FIG. 18 shows $I_D$-$V_D$ characteristics of a graphene/$WSe_2$ vertical transistor fabricated using the LRS technique.

FIG. 18 shows I$_D$-V$_D$ characteristics of a graphene/WSe$_2$ vertical transistor fabricated using the LRS technique. The I$_D$-V$_D$ curves were measured as VGs increases from about –70 V to about 70 V with 35 V step.

Figure 19B:
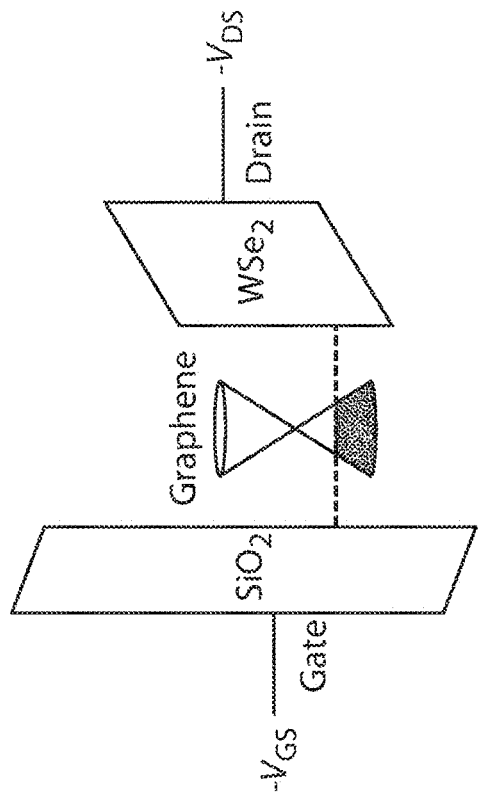
FIG. 19A and FIG. 19B show band diagrams of a graphene/$WSe_2$ heterojunction under positive and negative gate voltages, respectively.
Figure 19A:
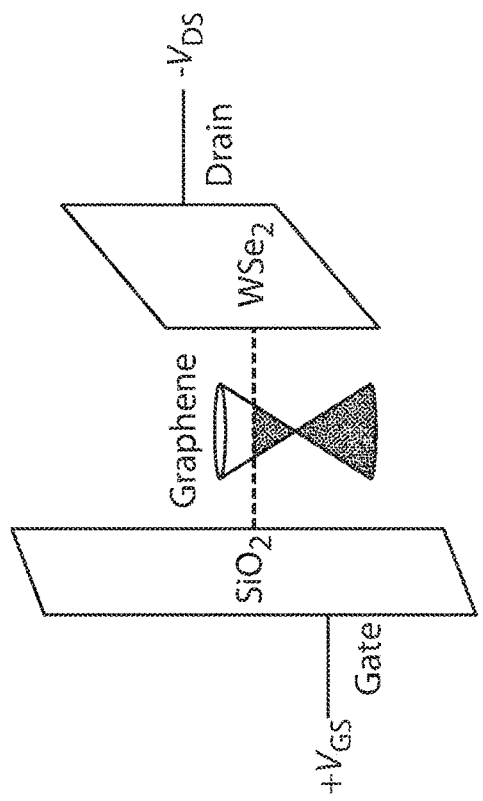

FIG. 19A and FIG. 19B show band diagrams of graphene/WSe$_2$ heterojunction under positive and negative gate voltages, respectively. A negative gate voltage induces hole carriers in graphene, increasing the work function of graphene and thus decreases the barrier height between graphene and WSe$_2$. Conversely, a positive gate voltage decreases the work function of graphene and increases the barrier height.

Figure 20B:
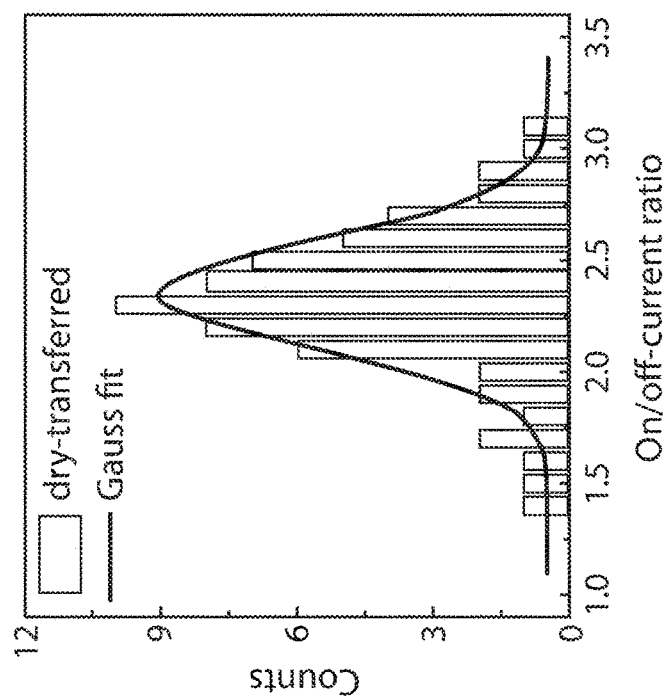
FIG. 20A and FIG. 20B show statistical distributions of on/off-current ratios in vertical transistor arrays fabricated by dry and wet transfer processes, respectively.
Figure 20A:
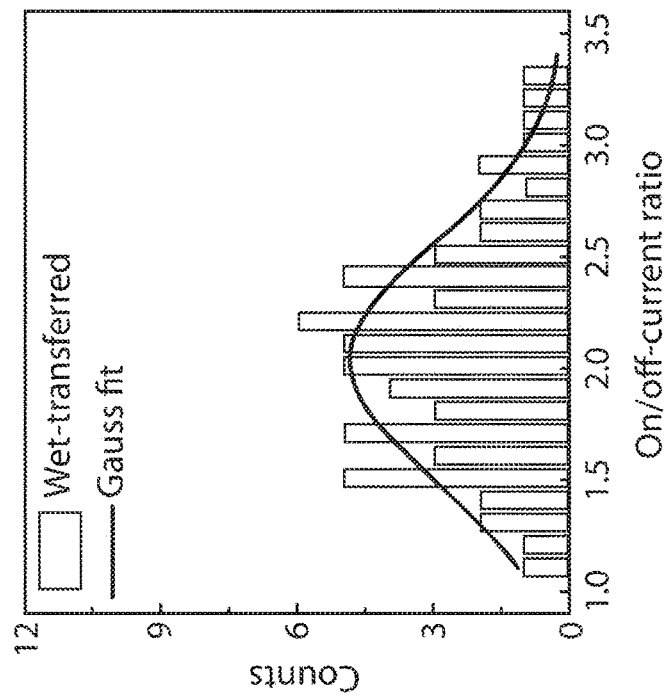

FIG. 20A and FIG. 20B show statistical distribution of on/off-current ratio in vertical transistor arrays fabricated by dry process and wet transfer process, respectively. These histograms show that the transistor arrays fabricated based on the dry-transfer process have improved electrical uniformity (e.g., about 63% higher than that fabricated wet-transfer process). The distribution of on/off ratios from the dry-stacked arrays show a device-to-device variation of about 9.6% (mean value of 2.37 with a standard deviation of 0.31) while the arrays made by wet-stacking has a 26% device-to-device variation (mean value of 2.13 with a standard deviation of 0.51).

Synthesis of h-BN h-BN films were grown directly on the 2-inch sapphire substrates with preflow of Triethylboron (TEB) but without any buffers using an Aixtron metalorganic vapor phase epitaxy (MOVPE) close coupled showerhead (CCS) 3×2-inch reactor. TEB and ammonia (NH$_3$) were used as B and N precursors, respectively. The h-BN growth temperature was 1280° C. Reactor pressure was maintained at 85 mbar. The TEB flow rate was 60 µmol min$^{-1}$ for both the preflow step (5-10 s) and the BN growth. V/III ratio was 1000 and the growth rate of h-BN is 15 nm h$^{-1}$.

Synthesis of WS$_2$.

WS$_2$ films were grown in a custom atmospheric pressure horizontal flow vapor phase epitaxy reactor. A 2-inch c-plane (0001) sapphire wafer was cleaned first with acetone, methanol, and isopropanol. Hydrogen sulfide and tungsten hexachloride were introduced through independent nozzles onto the sapphire wafer growth substrate which was supported on a rotating RF-heated graphite susceptor. Sheath flows of nitrogen and/or hydrogen were used to prevent recirculation within the quartz reaction chamber and to enhance reactant plume contact with the growth substrate. Thick films were grown with typical growth conditions: substrate temperature 850° C., chalcogen nozzle flow 2 slm of 1% hydrogen sulfide in balance nitrogen, metal nozzle flow 2 slm of WCl$_6$ in balance nitrogen for a total S:W ratio of 11,000, sheath flow of 1.5 slm hydrogen, and growth time of 10 minutes (growth rate: 3 nm h$^{-1}$). Wafer-scale films were grown with typical growth conditions: substrate temperature 950° C., chalcogen nozzle flow 1 slm of 10% hydrogen sulfide in balance 1:1 nitrogen:hydrogen mixture, metal nozzle flow 1 slm of WCl$_6$ in balance nitrogen for a total S:W ratio of 56,000 to 40,000, sheath flow of 1.5 slm nitrogen, and growth time of 30 minutes.

Synthesis of WSe$_2$.

WSe$_2$ films were grown in a VG Semicon V80H MBE system with an in-situ reflection high-energy electron diffraction (RHEED) system to monitor the crystal quality during growth. The base pressure for the growth chamber was maintained at ~2×10-10 mbar while the pressure during growth was ~1×10-9 mbar. The 2-inch c-plane (0001) sapphire wafer substrates were sequentially cleaned in acetone, methanol, isopropanol, and deionized (DI) water for 10 minutes each under an ultrasonic environment. After the solvent cleaning, the sapphire wafer was annealed in an oxygen environment ($O_2$ flow rate of 4 sccm) at 1050° C. for 3 hours and then loaded into the vacuum. During the $WSe_2$ growth, the substrate temperature was kept at 550° C., the flux pressure for the selenium effusion cell was maintained at $\sim 1 \times 10^{-6}$ mbar, and the W flux pressure, evaporated from elemental W pellets using an electron-beam evaporator, was $\sim 2 \times 10^{-9}$ mbar with the growth rate of around 1 $nm^{-1}$. A beam interruption strategy was adopted for this work, where the shutter for the W source was cyclically opened for 20 s and closed for 20 s while the Se shutter was kept open during the entire growth.

Synthesis of $MoSe_2$.

$MoSe_2$ films were grown in a home-built MBE system with an in-situ RHEED monitor. The base pressure for the growth chamber was maintained at $\sim 3 \times 10^{-10}$ mbar. The c-plane (0001) sapphire wafer substrates were sequentially cleaned in acetone, methanol, and isopropanol for 10 minutes each before loading into the vacuum. The $MoSe_2$ was grown at substrate temperature of 600° C. where Mo flux is 0.015 Å $s^{-1}$ and Se is 0.6 Å $s^{-1}$, which leads a growth rate of 6 nm $h^{-1}$.

Synthesis of $MoS_2$.

$MoS_2$ films were grown using MOCVD. A 300-nm-thick $SiO_2$/Si wafer was cleaned with normal degreasing process, by water, acetone, isopropanol, first and loaded in a quartz tube. Molybdenum hexacarbonyl and dimethyl sulfide were used as precursors and hydrogen gas and argon gas were used as carrier gases. The $MoS_2$ was grown under 7.5 torr at 550° C. with Molybdenum hexacarbonyl flow of 1 sccm, dimethyl sulfide flow of 0.3 sccm, argon gas flow of 300 sccm, and hydrogen gas flow of 10 sccm. The growth rate is 0.065 nm $h^{-1}$.

Layer-Resolved Split Process.

First, thick 2D materials were grown on substrates. Then a Ni film was deposited on the 2D materials. The 2D material/Ni stack was completely peeled-off using a thermal release tape as a handling layer. After peeling-off the 2D materials from the substrate, another Ni film was deposited on the bottom of 2D materials as a sticker to strongly adhere to the 2D material. Then, the 2D material stack was split into monolayer using a second thermal release tape handle layer on the bottom Ni film followed by transfer onto Si wafer coated with 90-nm-thick $SiO_2$ by pressing down the stack to the substrate (thermal release tape/Ni/2D material/substrate). The thermal release tape was removed by annealing above its release temperature of 110° C., then the Ni film was etched in ferric chloride ($FeCl_3$), followed by thorough rinsing in DI water. The above steps were repeated for multiple splits and transfers.

Crack Progression During Layer-Resolved Split Process.

The cracks propagate downwards due to mixed mode I and mode II fracture mechanisms. 2D materials grown at the edge of the wafer is usually defective, which can help the crack propagation. External bending moment induces spalling mode fracture. The opening mode stress (mode I) acts on the crack tip while the crack propagates with the guidance by a shear field (mode II). Thus, an initiated crack propagates downwards and advances lateral at the weakest interface.

Interfacial Toughness.

Ni film was deposited in a dual physical vapor deposition (PVD) system with a thermal evaporator source and plasma sputter source. A 45-nm-thick Ni film was initially deposited on the 2D materials by thermal evaporation as a protective layer for the 2D materials against damage from subsequent sputter deposition process. Additional Ni was then deposited using the sputtering system without breaking vacuum in the dual PVD chamber.

Dry-Transfer Process.

After splitting monolayer 2D materials via our LRS process, the stack of monolayer thermal release tape/Ni/2D material was transferred onto a target substrate by dry-transfer. The thermal release tape was detached by annealing above its release temperature of 110° C. Then, the Ni film was etched away in $FeCl_3$, followed by rinsing thoroughly in DI water. The above steps were repeated for fabricating heterostructures.

Wet-Transfer Process.

After transferring $WS_2$ monolayer onto $SiO_2$/Si substrate via our LRS process, PMMA layer was coated on the $WS_2$ film. Next, 2% diluted hydrofluoric acid (HF) solution was used to etch the $SiO_2$ layer between $WS_2$ and Si wafer, so that the PMMA film holding the $WS_2$ layer was isolated from the Si wafer. Due to the hydrophobic properties of PMMA, the PMMA/$WS_2$ film floated on the surface of HF solution while the Si wafer sank in the solution. Then, the PMMA/$WS_2$ film was washed in a deionized water bath for 1 hour to remove the residual HF, followed by transfer on to another $SiO_2$/Si substrate. The PMMA layer was washed away by acetone.

Fabrication of Thin Film Transistor.

Ti/Au source and drain electrodes (5/30 nm) were first prepared on a 300-nm-thick $SiO_2$/Si wafer by lift-off process. Subsequently, h-BN was transferred on some of the $SiO_2$/Si wafers through dry transfer based on LRS process. Next, $MoS_2$ layers obtained by our LRS process were transferred onto the h-BN coated $SiO_2$/Si or the bare $SiO_2$/Si through dry transfer. The $MoS_2$ layers were patterned by photolithography and etched with fluoroform ($CHF_2$) plasma to define an active area (W×L=300 μm×4 μm). A 50-nm-thick $Al_2O_3$ layer was deposited on the top of the wafers. Finally, the top-gate electrode (Cr/Au, 5/30 nm) was formed using photolithography and the lift-off process.

Vertical Transistor.

Ti/Au source electrodes (10/20 nm) were first defined on a $SiO_2$/Si wafer by lift-off process. The Si substrate served as the global back-gate. Subsequently, monolayer graphene was transferred on the $SiO_2$/Si wafer with source electrodes through dry-transfer based on LRS process or through wet-transfer methods. The transferred graphene was patterned using photolithography and oxygen plasma etching processes. Next, $WSe_2$ layers obtained by our LRS process were transferred onto the patterned graphene through dry-transfer or through wet-transfer methods. The $WSe_2$/graphene stacks were patterned by photolithography and fluoroform ($CHF_3$) plasma etching processes to define the active area. Finally, Ti/Au (10/20 nm) layers were deposited on the $WSe_2$ layer to form drain electrodes in an electron-beam evaporating system. The transistors exhibit an on/off-current ratio of 3.2 at a $V_{DS}$ value of −0.5 V.

Characterization.

The 2D materials were characterized using AFM, Raman, PL spectroscopy, and TEM. The AFM analysis was carried out in an XE 100 (Park Systems Corp.) system. Raman and PL studies were conducted using a Renishaw InVia Reflex Raman micro-spectrometer. The wavelength of laser was 532 nm, and the spot size of the laser was 2 μm. Light was dispersed by a holographic grating with 1,800 grooves $mm^{-1}$. The spectrometer was calibrated for every session by measuring a Si wafer. The dispersed light was collected by a RENCAM CCD detector.

Raman Spectroscopy and Photoluminescence.

Raman and PL studies were conducted using a Renishaw InVia Reflex micro-spectrometer. The 532 nm line of $Ar^+$ laser was used as the excitation source with a laser power of 2 mW, and the spot size of the laser was 2 μm. The light was dispersed by a holographic grating with 1,800 grooves $mm^{-1}$. The Si peak at 520 $cm^{-1}$ was used as a reference for wavenumber calibration for every session. The laser beam was focused onto the sample by a 50× microscope objective lens, and the dispersed light was collected by a RENCAM CCD detector. The spectral resolution was 1.2 $cm^{-1}$ with peak position accuracy of 0.1 $cm^{-1}$. For Raman and PL mapping images, the samples were placed on an x-y piezo stage and scanned under laser illumination.

X-Ray Photoelectron Spectroscopy.

X-ray photoelectron spectroscopy (XPS) was utilized to characterize elemental and chemical spectroscopic analysis of the exfoliated samples. It uses a C60 cluster-ion gun and a floating voltage argon ion gun for depth profiling, which allows us to perform XPS analysis with high depth resolution (10 nm) and spatial resolution of 10 μm under ultra-high vacuum (UHV) up to $10^{-9}$ torr.

Scanning Electron Microscope.

Scanning electron microscope (SEM) images were recorded using a high-resolution scanning electron microscope (ZEISS Merlin). The working distance was 5 mm with an accelerating voltage of 1.5 keV and a probe current of about 150 pA.

Laser Scanning Confocal Microscopy.

Olympus FV1000 Multiphoton laser scanning confocal microscope was utilized to characterize the surface condition of 2D materials prepared by LRS, including $WSe_2$, h-BN, $WS_2$, $MoSe_2$, and $MoS_2$.

Confocal Raman Microscope.

WITec CRM-200 was used to carry out a confocal Raman microscope. Raman shift of each sample was measured under 532 nm frequency-doubled Nd:Yag laser with a spatial resolution of 266 nm.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of designing and making the technology disclosed herein may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes (outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

U.S. Provisional Application No. 62/721,886, filed on Aug. 23, 2018, and entitled "ATOMIC PRECISION CONTROL OF WAFER-SCALE TWO-DIMENSIONAL MATERIALS" is incorporated herein by reference in its entirety for all purposes.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method, comprising:
forming a multilayer film comprising a plurality of monolayers of a two-dimensional (2D) material on a growth substrate, the multilayer film having a first side proximate to the growth substrate and a second side opposite the first side;
forming a first metal layer on the second side of the multilayer film;
removing the multilayer film from the growth substrate using the metal layer;
forming a second metal layer on the first side of the multilayer film; and
removing a first monolayer from the plurality of monolayers in the multilayer film.

2. The method of claim 1, wherein forming the multilayer film comprises epitaxially growing the multilayer film on the growth substrate.

3. The method of claim 1, wherein the 2D material comprises at least one of graphene, tungsten disulfide ($WS_2$), molybdenum diselenide ($MoSe_2$), tungsten diselenide ($WSe_2$), or hexagonal boron nitride (h-BN).

4. The method of claim 1, wherein the first metal layer comprises nickel.

5. The method of claim 1, wherein forming the first metal layer comprises sputtering metal on the second side of the multilayer film.

6. The method of claim 1, wherein removing the multilayer film from the growth substrate comprises applying a bending moment to the metal layer so as to generate and propagate a crack along an interface between the multilayer film and the growth substrate.

7. The method of claim 1, wherein the first monolayer has a lateral dimension substantially equal to or greater than 1 inch.

8. The method of claim 1, further comprising:
forming a third metal layer on a new first side of a multilayer film that results from removing the first monolayer from the plurality of monolayers;
removing a second monolayer from the plurality of monolayers in the multilayer film.

9. The method of claim 1, further comprising:
disposing the first monolayer over a second monolayer to form a heterostructure.

10. The method of claim 9, wherein the first monolayer comprises WSe$_2$, the second monolayer comprises graphene, and the heterostructure comprises a transistor.

11. A method of fabricating a heterostructure, the method comprising:
forming a first plurality of monolayers of a first two-dimensional (2D) material on a first growth substrate;
removing the first plurality of monolayers from the first growth substrate;
peeling a first monolayer in the first plurality of monolayers from a bottom surface of the first plurality of monolayers;
disposing the first monolayer on a host substrate;
forming a second plurality of monolayers of a second 2D material on a second growth substrate;
removing the second plurality of monolayers from the second growth substrate;
peeling a second monolayer in the second plurality of monolayers from a bottom surface of the second plurality of monolayers; and
disposing the second monolayer on the first monolayer to form the heterostructure.

12. The method of claim 11, wherein the first monolayer comprises WSe$_2$, the second monolayer comprises graphene, and the heterostructure comprises a transistor.

* * * * *